(12) United States Patent  
Yamanoi et al.

(10) Patent No.: US 8,164,757 B2  
(45) Date of Patent: Apr. 24, 2012

(54) FABRY-PEROT TYPE TUNABLE FILTER AND FABRICATION METHOD THEREOF

(75) Inventors: Toshio Yamanoi, Kanagawa (JP); Takashi Endo, Kanagawa (JP)

(73) Assignees: Yamachi Electronics Co., Ltd. (JP); Koshin Kogaku Co., Ltd. (JP)

( * ) Notice: Subject to any disclaimer, the term of this patent is extended or adjusted under 35 U.S.C. 154(b) by 354 days.

(21) Appl. No.: 12/593,035

(22) PCT Filed: Jan. 4, 2008

(86) PCT No.: PCT/JP2008/056491  
§ 371 (c)(1),  
(2), (4) Date: Nov. 23, 2009

(87) PCT Pub. No.: WO2008/123525  
PCT Pub. Date: Oct. 16, 2008

(65) Prior Publication Data  
US 2010/0091372 A1 Apr. 15, 2010

(30) Foreign Application Priority Data  
Apr. 3, 2007 (JP) .................... 2007-097411

(51) Int. Cl.  
*G01B 9/02* (2006.01)
(52) U.S. Cl. ....................................... 356/454
(58) Field of Classification Search ............ 356/454  
See application file for complete search history.

(56) References Cited

U.S. PATENT DOCUMENTS

| 6,275,324 | B1 | 8/2001 | Sneh | |
| 6,438,149 | B1 * | 8/2002 | Tayebati et al. | 372/45.01 |
| 6,744,805 | B2 * | 6/2004 | Wang et al. | 372/99 |
| 7,116,863 | B2 * | 10/2006 | Kim et al. | 385/27 |
| 2005/0157392 | A1 * | 7/2005 | Choi et al. | 359/578 |

FOREIGN PATENT DOCUMENTS

| JP | 2003215473 A | 7/2003 |
| JP | 200540878 A | 2/2005 |

OTHER PUBLICATIONS

PCT/JP2008/056491, International Search Report mail date Jul. 15, 2008.

\* cited by examiner

*Primary Examiner* — Roy M Punnoose  
(74) *Attorney, Agent, or Firm* — Banner & Witcoff, Ltd.

(57) ABSTRACT

To provide a miniaturized Fabry-Perot type tunable filter that can be applied to e.g. a light of wide wavelength range from infrared rays to ultraviolet rays and actuated at a low voltage. A movable portion moving in a direction parallel to the surface of the SOI substrate (hereafter called 'plane direction'), a suspension supporting member supporting the movable portion elastically and movably, and a fixed portion secured to the SOI substrate are provided. By the comb-teeth electrode of the comb-teeth type electrostatic actuator that moves the movable portion, the first mirror structure body formed bonding to the surface of the movable portion is controlled and moved in the plane direction. The Fabry-Perot type tunable filter has a structure in which the first mirror surface of the first mirror structure body and the second mirror surface of the second mirror structure body formed by bonding to the surface of the fixed portion are arranged facing to each other in parallel, and the length thereof is changed by the move of the plane direction.

12 Claims, 22 Drawing Sheets

FABRY-PEROT TYPE TUNABLE FILTER AND FABRICATION METHOD THEREOF

TECHNICAL FIELD

The present invention relates to the Fabry-Perot type tunable filter mounted in micro electro mechanical systems (MEMS) and fabricating method thereof.

BACKGROUND ART

Technologies that combine and unify the MEMS and small sized optical elements have vigorously been developed recently. Various tunable filters making the wavelength of resonating light changed have been proposed upon controlling and changing the distance of mirrors in the resonator constituted of a pair of optical mirrors located facing to each other in parallel by means of the MEMS, in the optical filter having the Fabry-Perot interferometer (FPI) structure. For example, aiming at application to the optical communication by the wavelength division multiplex (WDM) system, tunable devices for infrared rays in the wavelength band of C band (1.55 µm band), L band (1.58 µm band) and S band (1.49 µm band) have been exhibited (For example, refer to JP2003-101138).

The tunable filter in this case has a structure in which a silicon semiconductor or a compound semiconductor having the light transmittance state to the infrared ray band is employed as a material for the mirror structure body, and a pair of mirror structure bodies and the distance changing mechanism of mirror surfaces are integrally formed on the semiconductor substrate. Here, the pair of the mirror structure bodies is formed in such a manner that the mirror surfaces thereof are perpendicular to the surface of the substrate mentioned above, and one of the mirror structure bodies can move in the direction parallel to the substrate surface by means of the distance changing mechanism formed on the same substrate surface. However, such a tunable filter has a problem that the substrate mentioned above is not transparent to visible light and ultraviolet rays, so that it cannot be applied to a wide wavelength range of visible radiation including these wavelength bands.

Given this factor, a tunable filter of the FPI structure applicable to the light of wide range band including visible radiation has been proposed (For example, refer to JP2005-338534). For the tunable filter in this case, a first substrate of silicon and a second substrate having the light transmissive state to the wide wavelength range are laminated together. For a resonator comprising a first reflection film provided on the opening portion penetrating a specific position of the first substrate and a second reflection film located at the position of the second substrate facing to the first reflection film, impingement of the input light and outgoing of the output light are to be carried out with reference to the direction perpendicular to the first substrate surface and the second substrate surface as the optical axis.

Here, in order to change the distance between the first reflection film and the second reflection film, the first reflection film is formed on the movable portion of the first substrate, and the movable portion is to shift in the direction perpendicular to the surface of the substrate by means of the actuator constituted of so-called the parallel flat type electrostatic actuator. In this case, though application to the light of a wide wavelength band is possible, driving the actuator making the first reflection film move vertically becomes hard at a low voltage.

In addition, a tunable filter of the FPI structure has been indicated wherein each end surface of a pair of optical fibers, which are light guides, is positioned facing to each other as the mirror surfaces of the resonator mentioned above, and the distance between the end surfaces of the optical fibers is controlled by a parallel plane type electrostatic actuator (For example, refer to JP2006-525510). The tunable filter in this case can also be applied to a light of wide wavelength range. However in this case, miniaturization of the MEMS as well as low voltage driving of the actuator will become difficult.

DISCLOSURE OF INVENTION

Technical Problem

The present invention has been executed in the light of the circumstance mentioned above, and is intended to provide a Fabry-Perot type tunable filter with the FPI structure, which can be applied to a wide wavelength range of light from infrared rays to ultraviolet rays and further make an actuator of the MEMS driven at a low voltage easily. In addition, the present invention is aimed at facilitating miniaturization of the MEMS device that combines and unifies the Fabry-Perot type tunable filter.

Solution to Problems

To achieve the object mentioned above, the Fabry-Perot type tunable filter relating to the first feature of the invention is constituted of; a suspension supporting member movably supporting the movable portion, an actuator making the movable portion shifted in the plane direction, a fixed portion secured to the substrate, a first mirror structure body having a first mirror surface formed by being bonded to the surface of the movable portion, a second mirror structure body having a second mirror surface formed by being bonded to the surface of the fixed portion, and an optical resonator constituted by the first mirror surface and the second mirror surface located face to face spaced to each other in parallel, a resonating length of the optical resonator controlled by means of a distance between the mirror surfaces through operation of the actuator.

The Fabry-Perot type tunable filter relating to the second feature of the invention is constituted of; one substrate having a first movable portion and a second movable portion both thereof shifting independently to each other in a plane direction parallel to a surface of the substrate, a suspension supporting member movably supporting the movable portions respectively in a movable manner, a fixed portion secured to the substrate, an actuator making the first movable portion shifted in the plane direction, a first mirror structure body having a first mirror surface and bonded to the surface of the first movable portion, and a second mirror structure body having a second mirror surface and bonded to the surface of the second movable portion, and an initial gap forming mechanism securing the second movable portion to the fixed portion to form an initial gap as a gap between the first mirror surface and the second mirror surface both thereof being located face to face to each other on a condition that the actuator is not operating, and an optical resonator comprising the first mirror surface and the second mirror surface, a resonating length of the optical resonator changed by a distance between the mirror surfaces being controlled through operation of the actuator.

The fabrication method for a Fabry-Perot type tunable filter relating to the third feature of the invention is constituted of; processing an SOI substrate having an insulating layer and a silicon layer formed in this order on a silicon substrate, to form a movable portion shifting in a plane direction to the SOI substrate surface, a suspension supporting member supporting the movable portion, an actuator making the movable portion shifted in the plane direction and a fixed portion secured to the SOI substrate, bonding a first mirror structure body with a first mirror surface to a surface of the movable portion and bonding a second mirror structure body with a second mirror surface to a surface of the fixed portion upon condition that a first mirror surface and a second mirror surface are aligned face to face together in parallel, and forming an optical resonator constituted of the first mirror surface shifting by way of movement of the actuator and the second mirror surface secured to the fixed portion.

The fabrication method for a Fabry-Perot type tunable filter relating to the fourth feature of the invention is constituted of; processing an SOI substrate having an insulating layer and a silicon layer formed in this order on a silicon substrate, to form a movable portion shifting in a plane direction to the SOI substrate surface, a suspension supporting member supporting the movable portion, an actuator making the movable portion shifted in the plane direction and a fixed portion secured to the SOI substrate, bonding a first mirror structure body with a first mirror surface to a surface of the movable portion and bonding a second mirror structure body with a second mirror surface to a surface of the fixed portion upon condition that the movable portion is caught by the fixed portion and a first mirror surface and a second mirror surface come into contact with each other, and releasing the catching of the movable portion and the fixed portion and providing a gap between the first mirror surface and the second mirror surface after the bonding of the first mirror structure body and the second mirror structure body, and forming an optical resonator constituted of the first mirror surface shifting by way of movement of the driving portion and the second mirror surface secured to the fixed portion.

The fabrication method for a Fabry-Perot type tunable filter relating to the fifth feature of the invention is constituted of; processing an SOI substrate having an insulating layer and a silicon layer formed in this order on a silicon substrate, to form a first movable portion and a second movable portion both thereof shifting in a plane direction to the SOI substrate surface, a suspension supporting member movably supporting the movable portions, an actuator making the first movable portion shifted in the plane direction and a fixed portion secured to the SOI substrate, bonding a first mirror structure body with a first mirror surface to a surface of the movable portion and bonding a second mirror structure body with a second mirror surface to a surface of the fixed portion, making the first mirror surface and the second mirror surface come into contact with each other, and, providing a gap between the first mirror surface and the second mirror surface by way of connecting and securing the second movable portion to the fixed portion after the bonding of the first mirror structure body and the second mirror structure body, and forming an optical resonator comprising the first mirror surface shifting by movement of the actuator and the second mirror surface secured to the fixed portion.

ADVANTAGEOUS EFFECTS OF INVENTION

In accordance with the present invention, a tunable filter of the FPI structure where it can be applied to a light of wide wavelength band from infrared rays to ultraviolet rays and further can easily decrease the driving voltage of the actuator in the miniaturized MEMS is provided without difficulty.

BRIEF DESCRIPTION OF DRAWINGS

FIG. 12(a) is a plan view thereof and FIG. 12(b) is a cross sectional view thereof.

FIG. 13(a) is a plan view thereof and FIG. 13(b) is a cross sectional view thereof.

FIG. 16(a) is a plan view thereof and FIG. 16(b) is a cross sectional view thereof.

FIG. 17(a) is a plan view thereof and FIG. 17(b) is a cross sectional view thereof.

FIG. 18(a) is a plan view thereof and FIG. 18(b) is a cross sectional view thereof.

FIG. 19(a) is a plan view thereof and FIG. 19(b) is a cross sectional view thereof.

REFERENCE SIGNS LIST

Figure 1:
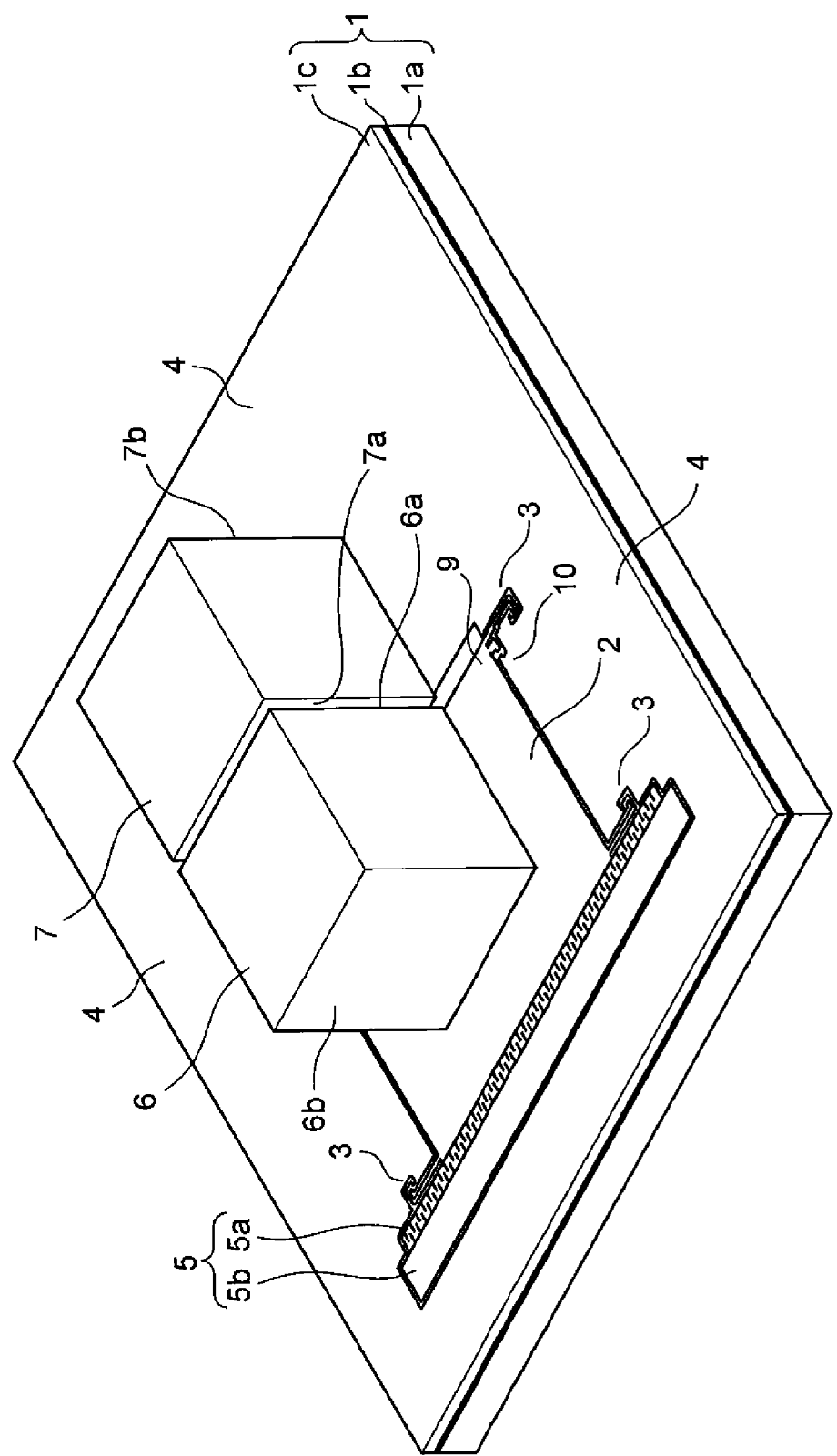
FIG. 1 is a perspective view showing an example of the Fabry-Perot type tunable filter according to the first embodiment of the present invention.

1: SOI substrate, 1a: supporting substrate, 1b: insulating layer, 1c: SOI layer, 2, 36: movable portion, 3: suspension supporting member, 3a: supporting member base, 3b: supporting member stress relaxing portion, 3c: supporting member hinge portion, 4: fixed portion, 5: comb-teeth electrode, 5a: movable side comb-teeth electrode, 5b: fixed side comb-teeth electrode, 51a: movable side comb-teeth electrode finger group, 51b: fixed side comb-teeth electrode finger group, 6: first mirror structure, 6a: first mirror surface, 6b, 7b: antireflection film, 6c, 7c: total reflection film, 7: second mirror structure, 7a: second mirror surface, 8: moving direction, 9: projected portion, 10: stopper portion, 11: first optical fiber, 12: input light, 13: collimate lens, 14: output light, 15: converging lens, 16: second optical fiber, 21: first etching mask, 22: passivation layer, 23: second etching mask, 24: opening part, 25: first conductive layer, 26: second conductive layer, 31, 41: first movable portion, 32, 42: second movable portion, 33: parallel plane electrode, 33a: movable side parallel plane electrode, 33b: fixed side parallel plane electrode, 34: gap, 35, 40, 43: initial gap, 37: hook mechanism, 38: first claw, 39: second claw

DESCRIPTION OF EMBODIMENTS

Some embodiments of the present invention will be hereinafter explained referring to the drawings. Portions in the figures that are the same or similar to each other are designated by a common reference sign and repeated explanation will be partly omitted.

First Embodiment

Figure 2:
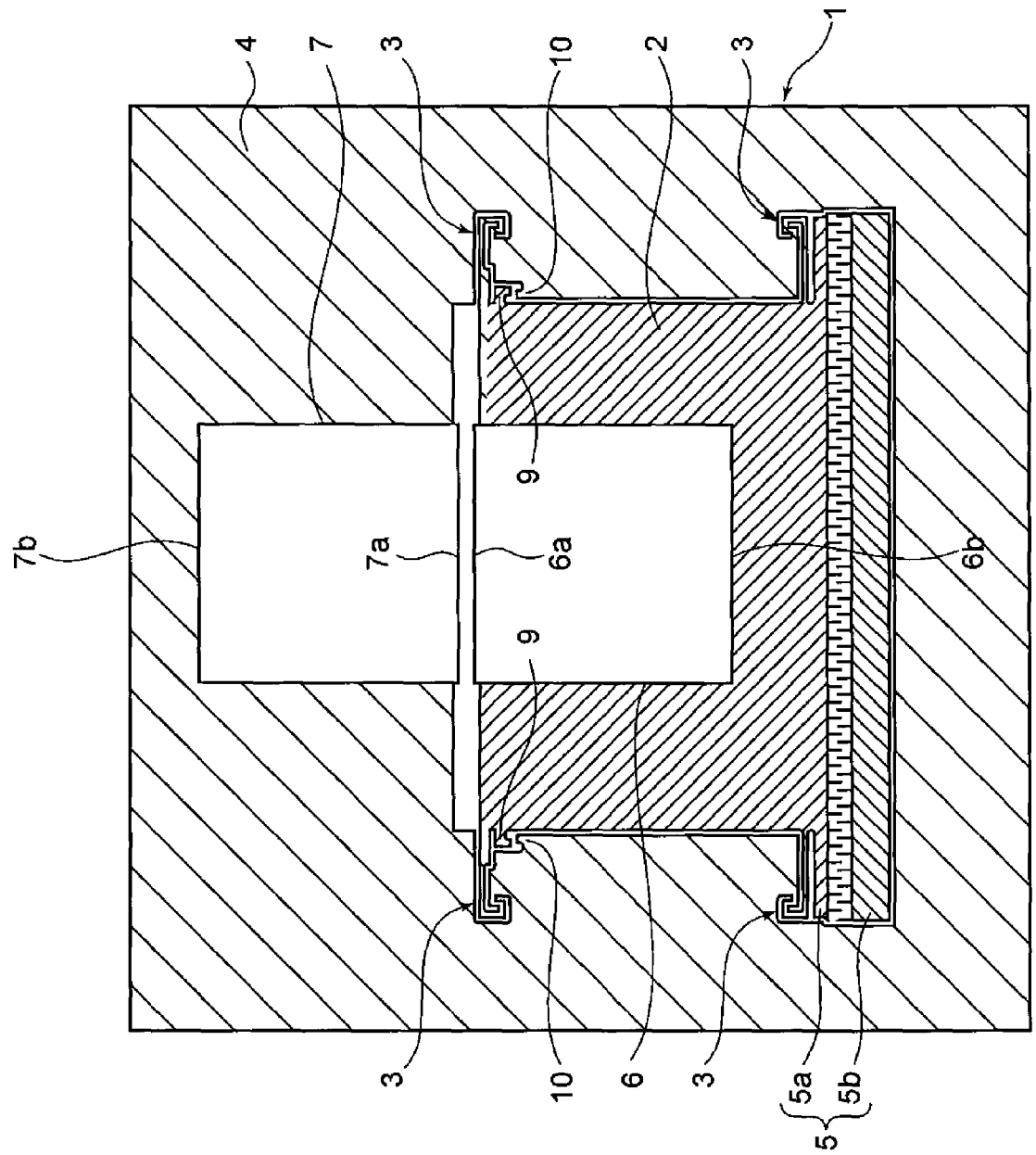
FIG. 2 is a plan view of the Fabry-Perot type tunable filter shown in FIG. 1.
Figure 3:
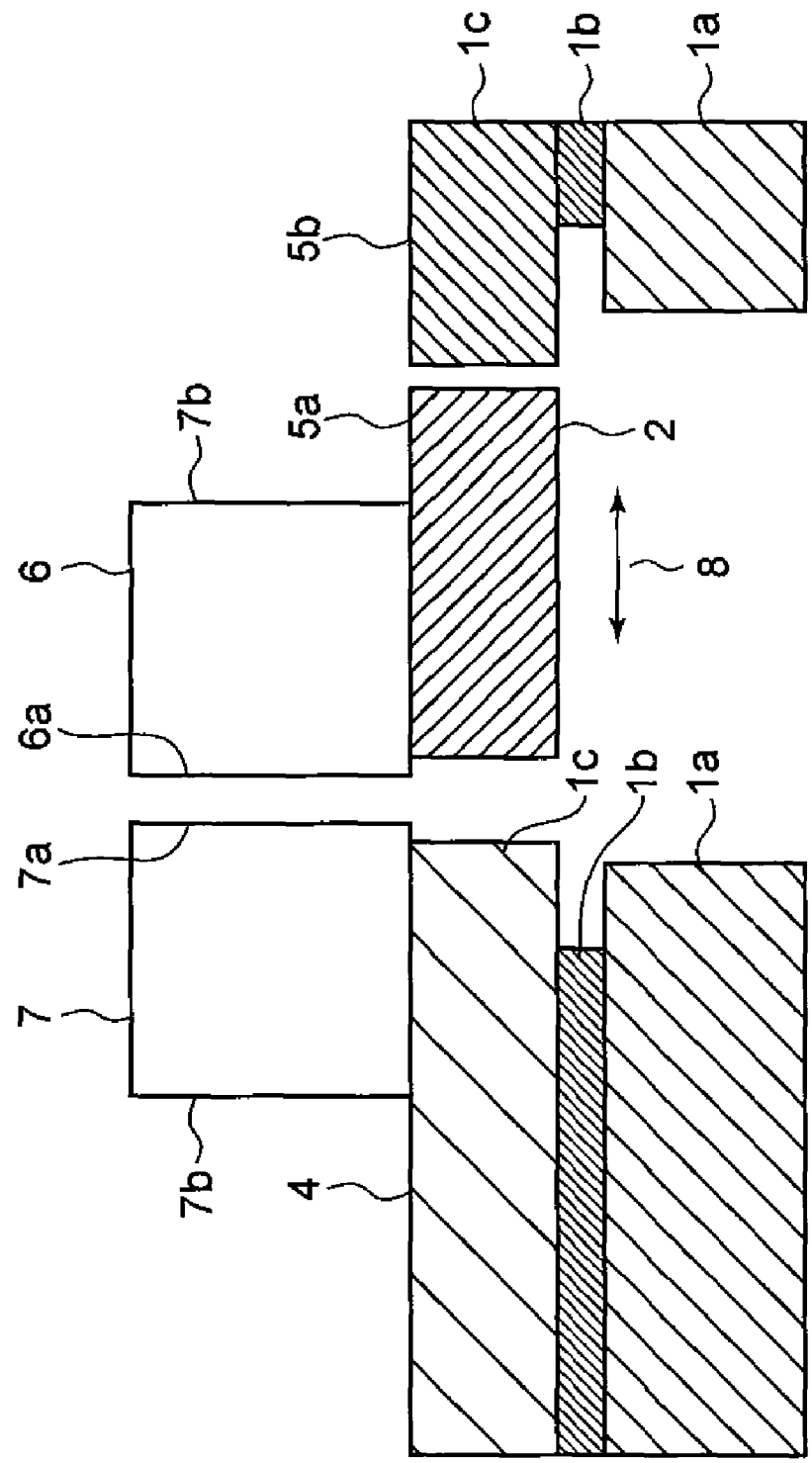
FIG. 3 is a pattern cross sectional view for explaining the Fabry-Perot type tunable filter according to the first embodiment of the present invention.
Figure 4:
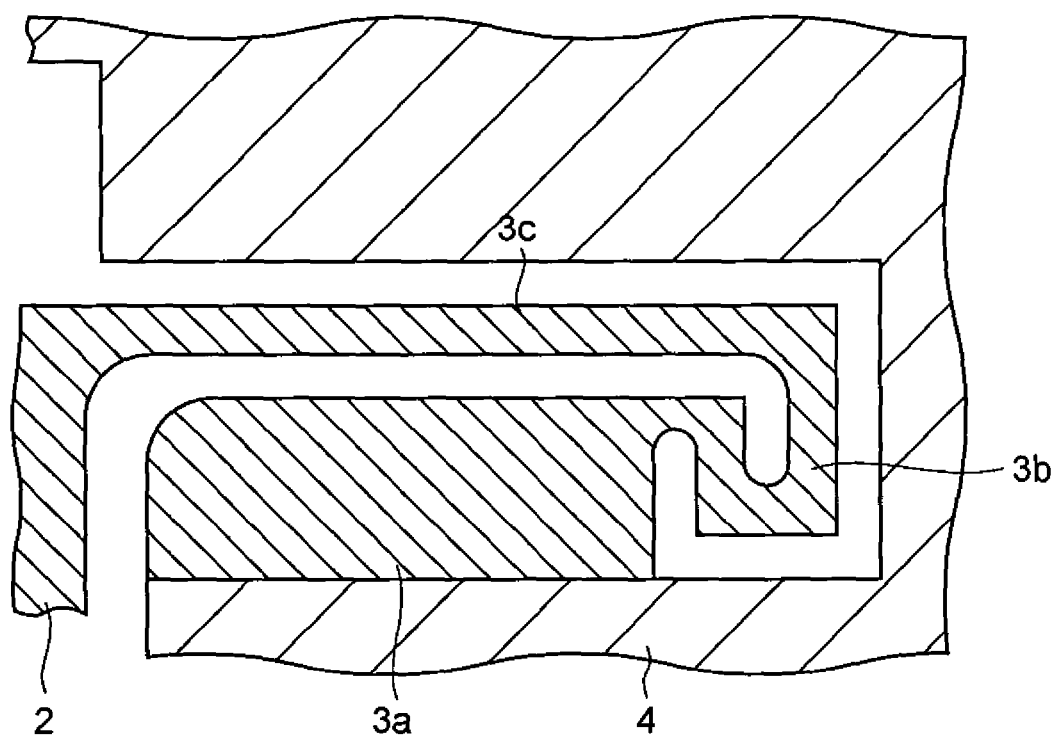
FIG. 4 is a magnified diagram showing an example of the suspension supporting member supporting the movable portion of the Fabry-Perot type tunable filter according to the first embodiment of the present invention.
Figure 5:
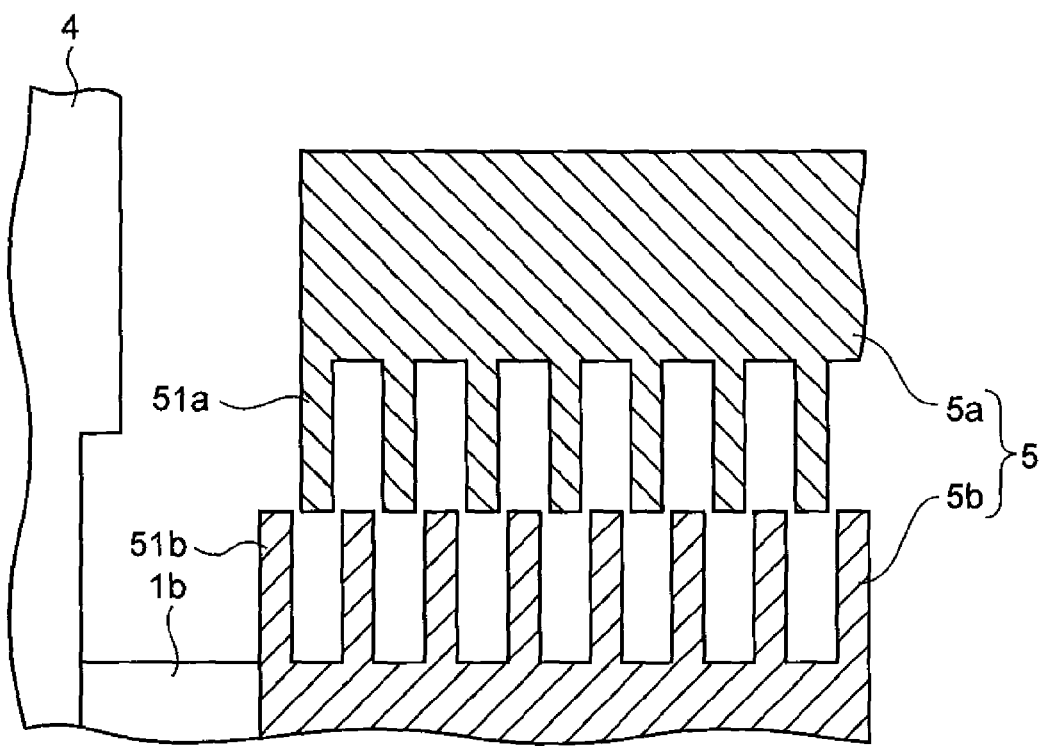
FIG. 5 is a magnified diagram showing an example of the comb-teeth electrode driving the movable portion of the Fabry-Perot type tunable filter according to the first embodiment of the present invention.
Figure 6:
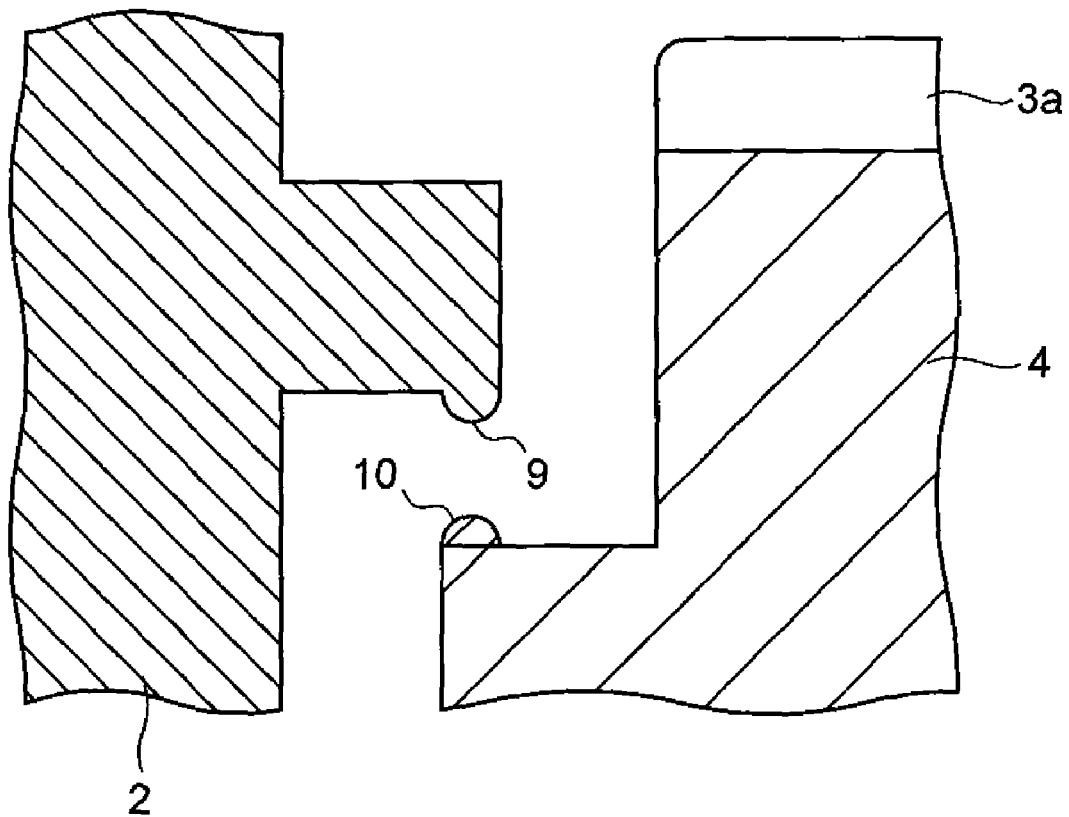
FIG. 6 is a magnified diagram showing an example of the stopper region restricting movement of the movable portion of the Fabry-Perot type tunable filter according to the first embodiment of the present invention.

Referring to FIG. 1 to FIG. 6, the Fabry-Perot type tunable filter according to the first embodiment of the present invention will be explained. FIG. 1 is a perspective view showing schematically an example of the Fabry-Perot type tunable filter. FIG. 2 is a plan view thereof and FIG. 3 is a pattern cross sectional view thereof. In addition, FIG. 4 is a magnified diagram showing an example of the suspension supporting member supporting the movable portion of the Fabry-Perot type tunable filter and FIG. 5 is a magnified diagram showing an example of the comb-teeth electrode driving the movable portion of the Fabry-Perot type tunable filter. Moreover, FIG. 6 is a magnified diagram showing an example of the stopper region to restrict movement of the movable portion.

AS shown in FIGS. 1, 2, the Fabry-Perot type tunable filter in this embodiment is combined and unified on a substrate. Here, the substrate is especially not restricted, but e.g. the Silicon on Insulator (SOI) substrate 1 can be quoted. The SOI substrate 1 comprises a supporting substrate 1a of silicon semiconductor, an insulative layer 1b of e.g. silicon oxide film and a silicon layer (SOI layer) formed on the supporting substrate 1a in superimposed state. For the following embodiment, an example in which the SOI substrate 1 is employed will be quoted.

In regard to the Fabry-Perot type tunable filter of this embodiment, a movable portion 2 that is formed in a predetermined region of the SOI layer 1c and can be moved in the direction parallel to the surface of the layer (i.e. the plane direction), and a plurality (4 pieces in the case of FIG. 2) of suspension supporting members 3 that support elastically the movable portion 2 are provided. On the substrate 1, by using the SOI layer 1c positioned around the movable portion 2 and connected with the supporting substrate 1a through the insulative layer 1b as the fixed portion 4, the movable portion 2 is supported by the suspension supporting members 3 at 4 corner points thereof in a movable manner, with the 4 points of the fixed portion 4 as the fixed ends.

The comb-teeth type electrostatic actuator carrying out displacement of the movable portion 2 in the plane direction is also mounted as the actuator. The comb-teeth electrode 5 constituting the comb-shaped electrostatic actuator is comprised of the movable comb-teeth electrode 5a formed integrally on the movable side portion 2 and the fixed side comb-teeth electrode 5b secured to the predetermined position of the fixed portion 4. The movable side comb-teeth electrode 5a and the fixed side comb-teeth electrode 5b are positioned facing to each other as mentioned later.

The first mirror structure body 6 is formed upon being bonded to the surface of the movable portion 2, and the second mirror structure body 7 is formed upon being bonded to the surface of the predetermined place of the fixed portion 4. Here, the first mirror structure body 6 and the second mirror structure body 7 are disposed close to each other. The first mirror surface 6a formed on the first mirror structure body 6 and the second mirror surface 7a formed on the second mirror structure body 7 are placed facing to each other in parallel so as to constitute an optical resonator. These mirror surfaces are formed approximately perpendicular to the surface of the SOI layer 1c.

As shown in FIG. 3, upon displacing the first mirror structure body 6 mounted on the movable portion 2 in the plane direction along the moving direction 8 of the movable portion 2, distance between the first mirror surface 6a and the second mirror surface 7a is varied, so that the resonator length of the optical resonator can be changed. Displacement of the movable portion 2 is controlled by the electrostatic force acting between the movable side comb-teeth electrode 5a and the fixed side comb-teeth electrode 5b of the comb-teeth type electrostatic actuator, which is the actuator.

In regard to the movable portion 2 to which the first mirror structure body 6 is bonded, the SOI layer 1c is processed to be e.g. a predetermined square pattern to the size of the first mirror structure body 6 as shown in the fabrication method mentioned later. Furthermore, as shown in FIG. 3, the insulative layer 1b and the supporting substrate 1a under the pattern region are removed. The movable portion 2 is suspended and supported by the elastic suspension supporter 3 described later. Thus, the movable portion 2 can be displaced in approximately one-dimensional direction along the shifting direction 8 of FIG. 3.

As shown in FIG. 4, the suspension supporting member 3 is comprised of the supporting member base portion 3a extending from the fixed end of the fixed portion 4, the supporting member stress absorbing portion 3b and the supporting member hinge portion 3c. The supporting member base portion 3a, the supporting member stress absorbing portion 3b and the supporting member hinge portion 3c are the SOI layer 1c processed in a predetermined pattern as described later, where the insulative layer 1b and the supporting substrate launder the pattern region are removed. The supporting member hinge portion 3c suspends the movable portion 2, and the supporting member stress absorbing portion 3b supports the movable portion 2 in elastically movable mode together with the supporting member hinge portion 3c in the shifting direction 8 shown in FIG. 3.

Elasticity of the suspension supporting member 3 is determined by the thickness and the degree of elasticity of the SOI layer 1c, dimensions of the supporting member hinge portion 3c, etc. The degree of elasticity of the SOI layer 1c depends on content of impurities such as boron, phosphor, arsenic, antimony, oxygen, carbon, nitrogen, etc. Usually, mechanical strength of the suspension supporting member 3 increases by doping of these impurities, but elastic deformation thereof is decreased and brittleness comes to be apt to occur as content of doping increases. Therefore, it is necessary to set appropriately the dimensions of the suspension supporting member 3 such as the supporting member hinge portion 3c etc. and the content of the impurity doping in compliance with the range of elastic moving of the moving portion 2.

As shown in FIG. 5, the comb-teeth type electrostatic actuator has the comb-teeth electrode 5 whose movable side comb-teeth electrode 5a and the fixed side comb-teeth electrode 5b have the movable side comb-teeth electrode finger group 51a and the fixed side comb-teeth electrode finger group 51b respectively. The movable side comb-teeth electrode finger group 51a and the fixed side comb-teeth electrode finger group 51b are disposed so as to intervene mutually and formed in such a manner that the gap between each electrode finger of the movable side comb-teeth electrode finger group 51a and each intervening adjacent electrode finger of the fixed side comb-teeth electrode finger group 51b may be approximately equal to one another. Here, these electrode finger groups are the SOI layer 1c processed in the pattern of electrode fingers, and the insulative layer 1b and the supporting substrate 1a under the pattern region are removed.

An electrode pad is provided on a predetermined region of the movable side comb-teeth electrode 5a or the movable portion 5 integrally formed thereto (not shown in the figure), so that a desirable voltage can be supplied from outside through the electrode pad. Here, the movable comb-teeth electrode 5a is fixed to the earth potential. In the same way, another electrode pad is provided on a predetermined region of the fixed side comb-teeth electrode 5b (not shown in the figure), so that a desirable e.g. a positive voltage can be supplied in a variable manner through another electrode pad.

The fixed side comb-teeth electrode 5b is formed by an SOI layer, which has been processed in a predetermined pattern, on the predetermined place of the fixed portion 4. Here, peripheries of the fixed side comb-teeth electrode 5b except for the fixed side comb-teeth electrode finger group 51b are defined by removal of the SOI layer 1c by etching, so that the supporting substrate 1a and the insulative layer 1b have remained.

As the movable side comb-teeth electrode 5a and the fixed side comb-teeth electrode 5b need electric conductivity, n-conductive type or p-conductive type impurity mentioned above may be doped on the SOI layer 1c of the region or a conductive layer of e.g. aluminum (Al), gold (Au), etc. may be formed on the SOI layer 1c of the region.

A variable voltage is applied between the movable side comb-teeth electrode 5a and the fixed side comb-teeth electrode 5b. The movable side comb-teeth electrode 5a i.e. the movable portion 2 is displaced along the shifting direction 8 of FIG. 3 by an electrostatic attracting force generated by the electric field between them. Here, the amount of displacement can be arbitrarily controlled by the applied voltage.

As to the electrostatic actuator in general, so-called 'pull-in phenomenon', which increases rapidly amount of displacement between electrodes, may occur when a voltage is applied between electrodes facing to each other and the gap thereof comes to be in a certain region. The pull-in phenomenon is irreversible to voltage supplying and has hysteresis, so that it is not suitable to displacement control of the movable portion 2. Therefore, as shown in FIG. 1, FIG. 2 and FIG. 6, the projected portion 9 is provided on a predetermined portion (2 positions of FIG. 2) of the movable portion 2. The projected portion 9 is to bump into the stopper portion 10 provided on the corresponding region of the fixed portion 4 so as to prevent the movable portion 2 from moving excess a certain limit. Restricting the movement of the movable portion 2 assures that the movable side comb-teeth electrode finger group 51a and the fixed side comb-teeth electrode finger group 51b located intervening to each other do not exist within a region of a certain distance.

The first mirror structure body 6 and the second mirror structure body 7 are made of a material which is transparent to an objective light in the range from infrared rays to ultraviolet rays. Such materials for the above are selected in accordance with usage, from non-alkali glass, white glass of borosilicate glass, quartz glass having silicon dioxide as the main component, or optical glass such as e.g. BK7 (trade name), WMS-13 (trade name), sapphire, $LiNbO_3$, $CaF_2$, semiconductors such as silicon and germanium, and synthetic resin. Here, these structure bodies may be a structure that is transparent to the light of a specific wavelength, or may be transparent to the whole wavelength range from infrared rays to ultraviolet rays.

These mirror structure bodies are formed in a predetermined shape like e.g. a cube of 1 $mm^3$ respectively. Here, the first mirror surface 6a and the second mirror surface 7a disposed facing to each other in parallel have been fabricated in such a manner that a metallic film or a dielectric multilayer film having a high reflection to the objective light is deposited on each one surface of the first mirror structure body 6 and the second mirror structure body 7 by means of e.g. vapor deposition, sputtering, or ion-plating.

In addition, the first mirror surface 6a and the second mirror surface 7a may be formed by processing the mirror structure bodies instead of depositing a metallic film or a dielectric multilayer film on one surface of the first mirror structure body 6 and the second mirror structure body 7 respectively. Otherwise, the mirror structure body may be fabricated by a metallic film or a dielectric multilayer film.

Here, for instance, Au, Ag, Al, etc. are employed as the metallic film. $TiO_2$, $Y_2O_3$, $Ta_2O_5$, $ZrO$, $ZrO_2$, Si, ZnS, $HfO_2$, Ge, $Nd_2O_6$, $Nb_2O_5$, $CeO_2$, ZnO, $Fe_2O_3$, $SiO_2$, $MgF_2$, $AlF_3$, $CaF_2$, LiF, $Na_3AlF_6$, $Na_5Al_3F_{14}$, $Al_2O_3$, $CeF_3$, MgO, $LaF_3$, $PbF_2$, PbI, $NdF_3$, etc. or mixture thereof are employed as the dielectric multilayer film. Additionally, at least two kinds of the dielectric materials, which are a high refractive film and a low refractive film, are deposited alternately in a predetermined thickness so as to become a multilayer, are utilized. When the objective light is for example infrared rays, a multilayer film of Te film and KBr film is used favorably. When the objective light is e.g. ultraviolet rays, a multilayer film of ZnS film and cryolite film, or a multilayer film of $Sb_2O_3$ film and cryolite film is used favorably.

For the first mirror structure body 6 and the second mirror structure body 7, the antireflection films 6b and 7b are coated on the surface on which the input light is incident and the surface from which the output light emits respectively. As these antireflective films, a monolayer film or a multilayer film transparent to the objective light and having a refractivity lower than that of the first mirror structure body 6 and the second mirror structure body 7 is employed. These antireflective films are also formed on one surface of the first mirror structure body 6 and the second mirror structure body 7 respectively by means of deposition, sputtering, etc.

Figure 7:
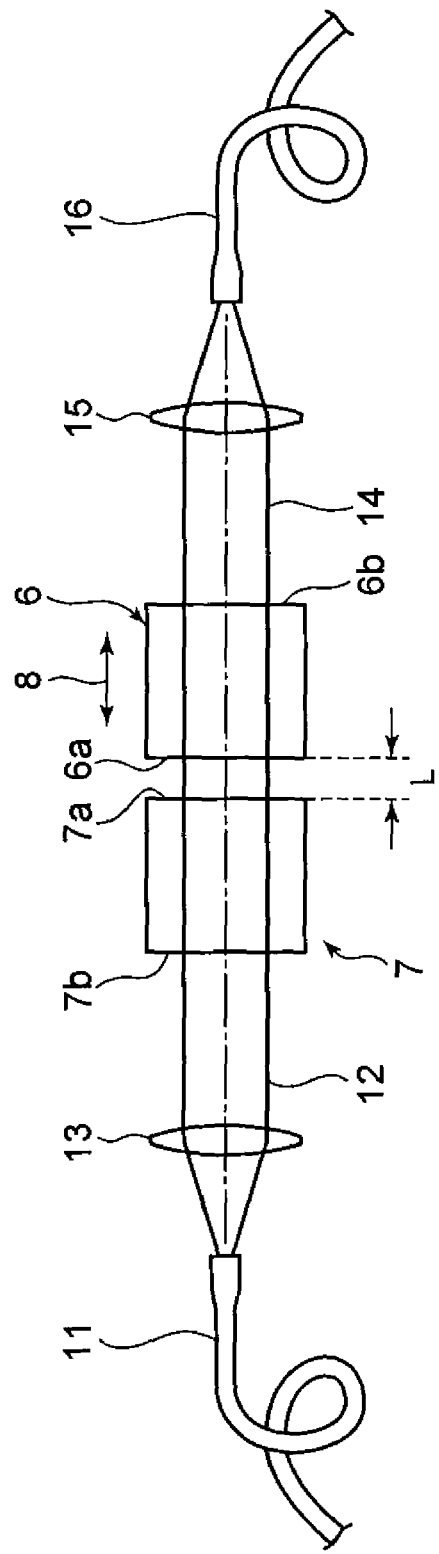
FIG. 7 is a pattern diagram of the optical system explaining movement of the Fabry-Perot type tunable filter according to the first embodiment of the present invention.

In the next place, operation of the Fabry-Perot type tunable filter of this embodiment will be explained referring to FIG. 7 to FIG. 9. FIG. 7 is a pattern diagram of the optical system of the Fabry-Perot type tunable filter. FIG. 8 and FIG. 9 are pattern diagrams showing various conformations of input light and output light in the Fabry-Perot type tunable filter.

As shown in FIG. 7, the input light 12 of a predetermined wavelength range, which emits from the first optical fiber 11 on the left side, is collimated by the collimator lens 13, and for example, is incident on one surface on which the antireflection film 7b is formed, of the cubic second mirror structure body 7, with the optical axis thereof perpendicular to the surface. Then, in the optical resonator that is constituted of the second mirror surface 7a on the opposite side thereof and the first mirror surface 6a of e.g. the cubic first mirror structure body 6 disposed facing to each other in parallel, only the light of the wavelength $\lambda_m$ satisfying the formula (1) resonates and passes through in the right direction of the first mirror structure body 6 to become the output light 14. Here, the light having passed through emits along the optical axis from the opposite surface on which the antireflective film 6b is formed facing to the first mirror surface 6a of the first mirror structure body 6, and is connected to the second optical fiber 16 through e.g. the focusing lens 15.

$$\lambda_n = 2\,nL/m \tag{1}$$

where n is the refraction index of the space between the first mirror surface 6a and the second mirror surface 7a. L is the distance between the first mirror surface 6a and the second mirror surface 7a, and m indicates a positive integer.

The distance L between the first mirror surface 6a and the second mirror surface 7a can be arbitrarily set upon displacing the first mirror structure body 6 in the shifting direction 8 shown in FIG. 3 by operating the comb-shaped electrostatic actuator. For example, the movable side comb-teeth electrode 5a fabricated integrally with the movable portion 2 shown in FIG. 5 is set to be the earth potential and a variable positive voltage is applied to the fixed side comb-teeth electrode 5b. In this case, the distance L between the first mirror surface 6a and the second mirror surface 7a is univocally determined to the value of positive voltage, and the distance L increases as the value of the positive voltage is raised. Thus, the resonating length of the resonator constituted of the first mirror surface 6a and the second mirror surface 7a can be changed by controlling the voltage of the comb-teeth electrode 5 of the comb-shaped electrostatic actuator, and then the resonated and transmitted light at the resonated length is variably filtered as the output light 14. Here, designing can be carried out in such a manner that an increasing amount of the positive voltage becomes proportional positively to an increasing amount of the value of the distance L.

In regard to such a Fabry-Perot type tunable filter, tunable filtering can be carried out in a predetermined wavelength range from infrared rays to ultraviolet rays. For instance, for the Fabry-Perot type tunable filter in which the first mirror structure body 6 and the second mirror structure body 7 are formed by synthetic quartz, the half maximum full-width of the light transmission spectrum for propagation in the air was stable to be 2.6 to 2.9 nm for the measurement of the filter characteristic to the objective light of infrared rays from 1450 nm to 1580 nm. The fact above indicates that the wavelength interval of the signal light can be set to be approximately 10 nm and the number of the wavelength of multiplexing can be a degree of 10 waves.

As mentioned above, for the Fabry-Perot type tunable filter, the first mirror surface 6a, the second mirror surface 7a, the antireflection films 6b, 7b are appropriately selected in accordance with the wavelength range of the objective light. In accordance, tunable filtering is possible in a desirable wavelength range of the objective light. However, when the objective light is ultraviolet rays having a short wavelength, it is desirable that transmission loss of the light should be reduced by making the transmitting atmosphere be in a decompression condition of less air.

With respect to operation of the Fabry-Perot type tunable filter mentioned above, the distance L between the first mirror surface 6a and the second mirror surface 7a is determined by the voltage of the comb-teeth electrode 5, so that the light of wavelength $\lambda_m$, which satisfies the formula (1), is filtered and pulled out as the output light 14. In this case, upon forming the electrodes on a part of the portions of the first mirror surface 6a and the second mirror surface 7a respectively, through which the light does not pass, sensing the change of the distance L can also be available by monitoring the capacitance between the electrodes.

In regard to operation of the Fabry-Perot type tunable filter explained by FIG. 7, explanation has been carried out in the case where the optical paths of the input light 12 and the output light 14 are along the optical axis perpendicular to the second mirror surface 7a and the first mirror surface 6a. Here, the optical paths of the input light 12 and the output light 14 are applicable even if they have any misalignment with reference to the direction perpendicular to these mirror surfaces. However, in this case, when the angle which the input light 12 makes the direction perpendicular to the second mirror surface 7a is denoted by θ, only the light of wavelength $\lambda_m$, which satisfies the formula (2), resonates and passes through to become the output light 14. In this case, the incident angle θ should not be too large in order that the input light 12 or the output light 14 may not depart from the second mirror structure body 7 or the first mirror structure body 6.

$$\lambda_n = 2\,nL\cos\theta/m \tag{2}$$

where n, L and m are the same as those of the formula (1).

Operation of the above-mentioned Fabry-Perot type tunable filter can be executed in the same way even though the structure thereof is that propagation of the input light and the output light is the inverse direction to the direction explained referring to FIG. 7. In addition, some spread of the input light in the parallel light after collimated by the collimate lens is applicable. However, small spread of the input light and high collimation level will be desirable because the half maximum full-width of the light transmission spectrum of the above-mentioned output light becomes small.

Figure 8A:
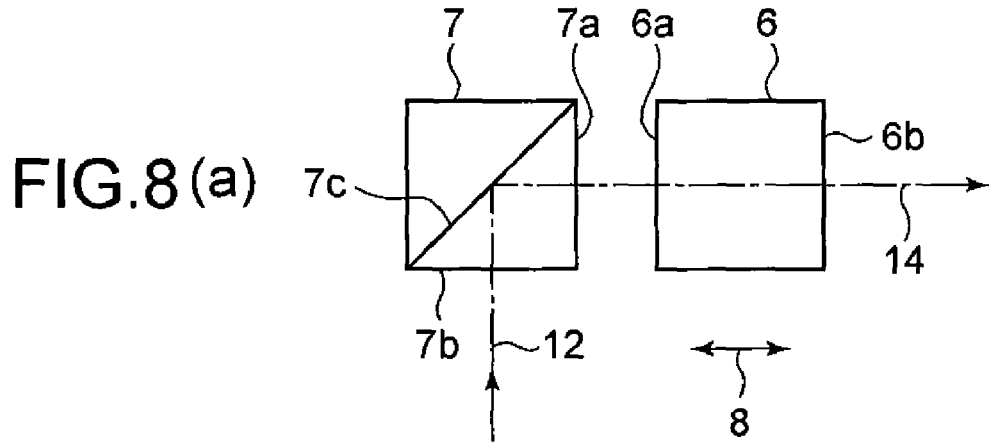
FIGS. 8(a) to 8(c) are pattern diagrams showing some conformations of input light and output light for movement of the Fabry-Perot type tunable filter.
Figure 8B:
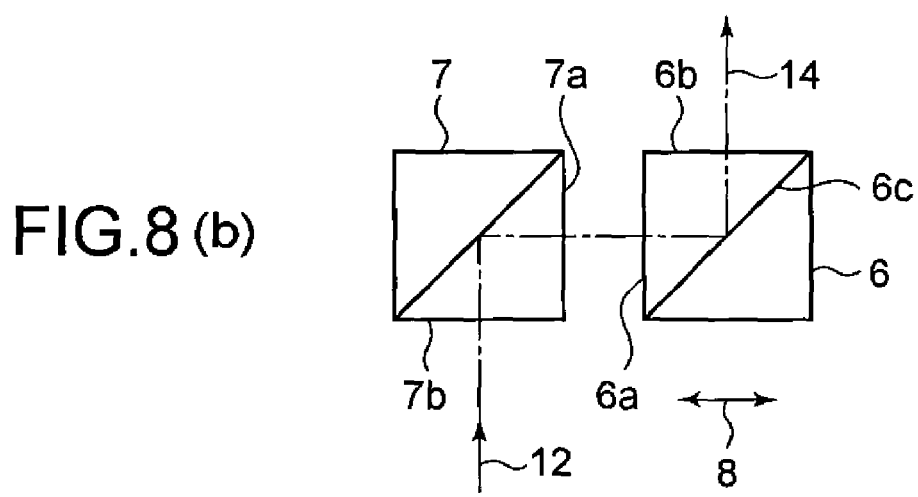
Figure 8C:
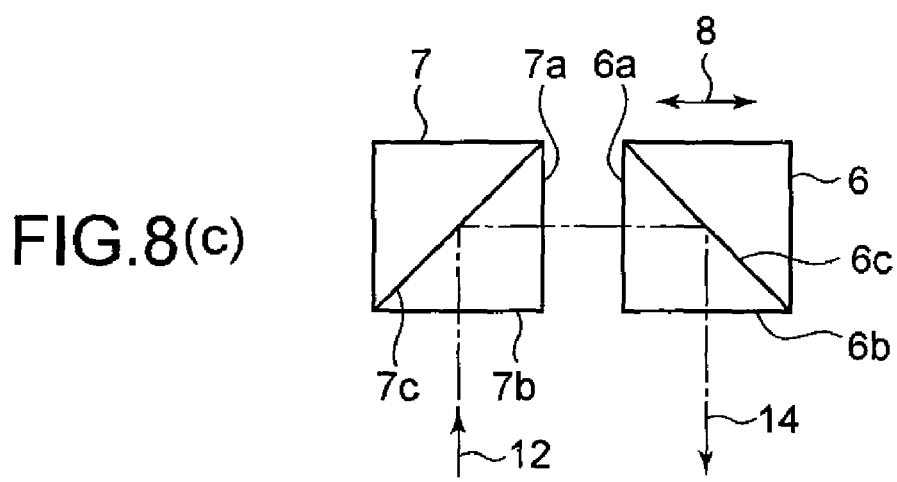
Figure 9A:
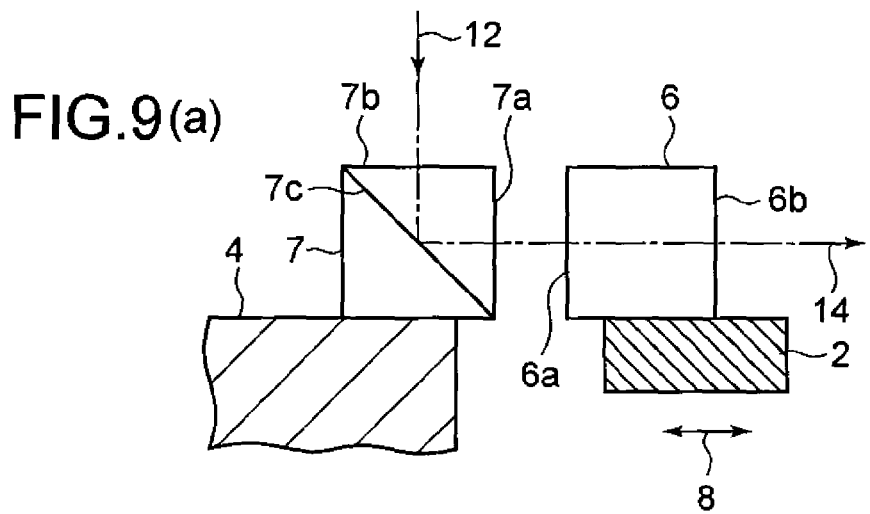
FIGS. 9(a) to 9(c) are pattern diagrams showing the other conformations of input light and output light for movement of the Fabry-Perot type tunable filter.
Figure 9B:
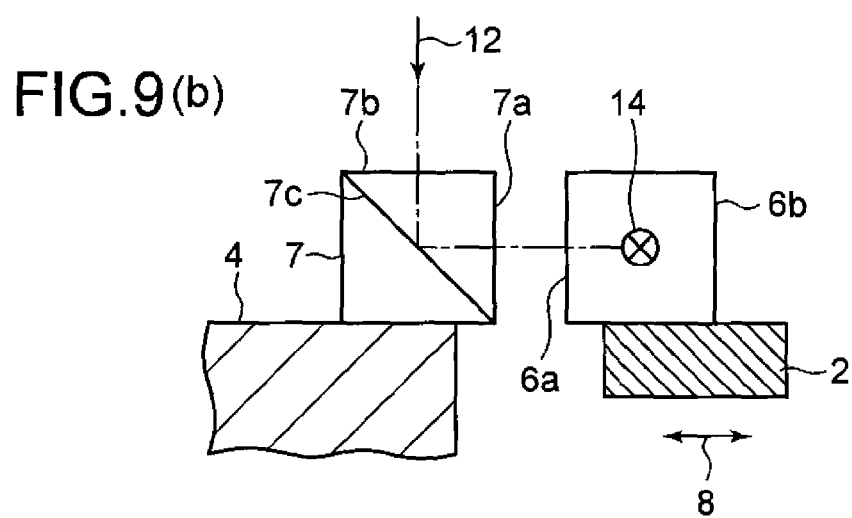
Figure 9C:
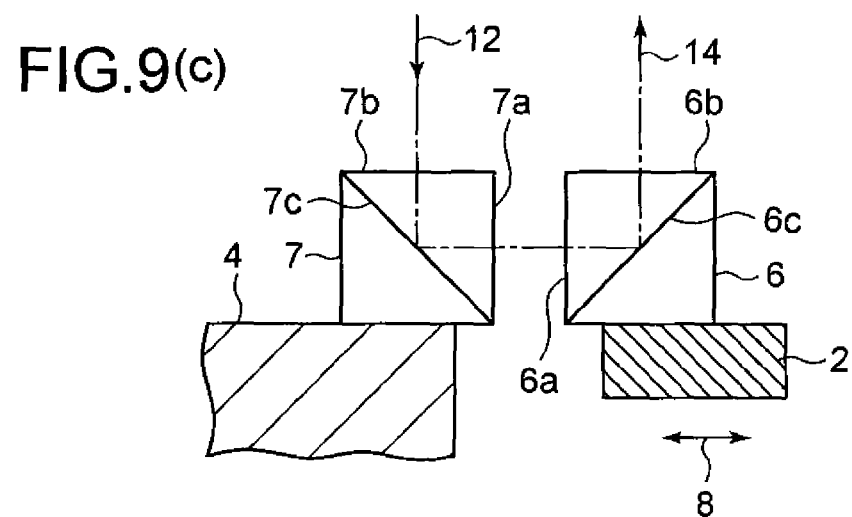
Figure 10A:
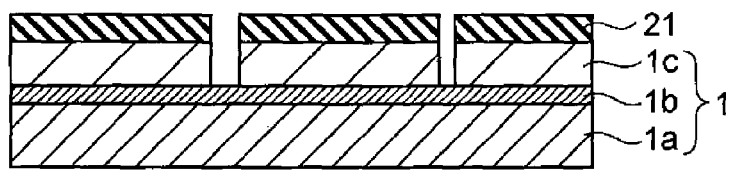
FIGS. 10(a) to 10(f) are schematic cross sectional views of processes showing an example of fabrication method of the Fabry-Perot type tunable filter.
Figure 10B:
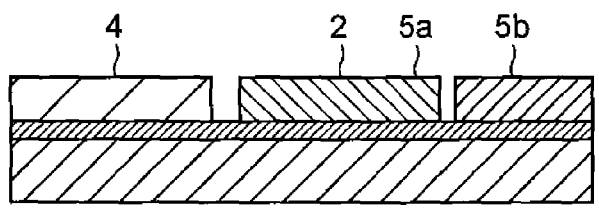
Figure 10C:
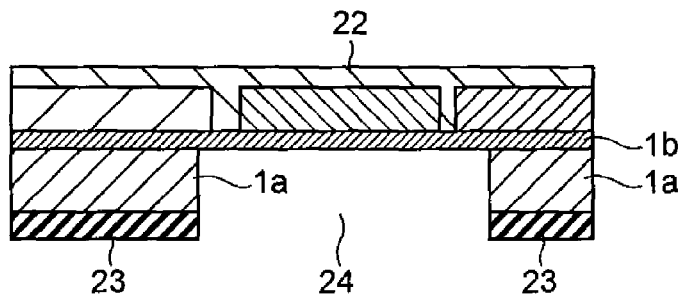
Figure 10D:
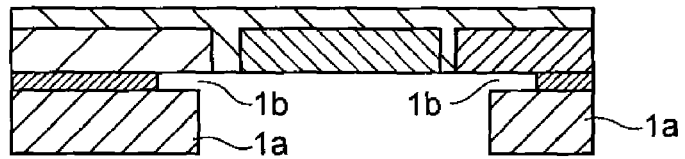
Figure 10E:
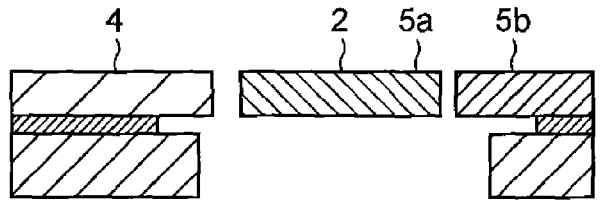
Figure 10F:
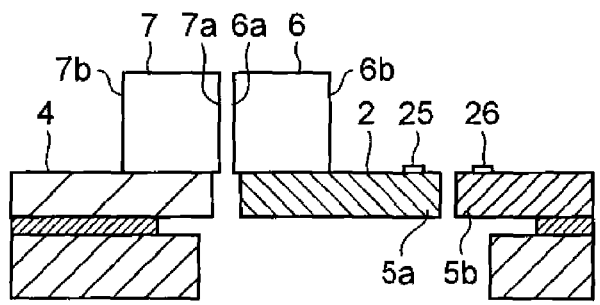

Furthermore, in respect to the Fabry-Perot tunable filter of this embodiment, it is possible that the optical path of the input light or the output light mentioned above takes various directions. Referring to FIGS. 8(a) to 8(c) and FIGS. 9(a) to 9(c), some examples thereof will be explained. Here, FIGS. 8(a) to 8(c) show top views of the first mirror structure body 6 and the second mirror structure body 7 observed from upside thereof. FIGS. 9(a) to 9(c) show side views of the first mirror structure body 6 and the second mirror structure body 7 observed from side thereof. For simplification, only the first mirror structure body 6, the second mirror structure body 7 and the optical path of the objective light are displayed in these figures.

In FIG. 8(a), the total reflection film 7c is provided on, for example, a diagonal plane of the cubic second mirror structure body 7. The input light 12 is vertically incident on the side surface of the mirror structure body 7, on which the antireflection film 7b is formed, and takes a bent of 90 degrees by the total reflection film 7c. Then, in the optical resonator constituted of the second mirror surface 7a and the first mirror surface 6a of the first mirror structure body 6 located facing to each other in parallel, the output light 14 resonated and filtered out thereby emits in the right direction of the first mirror structure body 6.

In FIG. 8(b), the input light 12 incident on the second mirror structure body 7 takes a bent of 90 degrees by the total reflection film 7c as is the case explained by FIG. 8(a). Then, in the optical resonator constituted of the second mirror surface 7a and the first mirror surface 6a of the first mirror structure body 6 located facing to each other in parallel, the output light 14 resonated and filtered out thereby emits in the up direction of the first mirror structure body 6.

In FIG. 8(c), as is the case of FIG. 8(b), in the optical resonator constituted of the second mirror surface 7a and the first mirror surface 6a of the first mirror structure body 6 located facing to each other in parallel, the output light 14 resonated and filtered out thereby emits this time in the down direction upon being reflected by the total reflection film 6c on the diagonal plane formed on the opposite side of the first mirror structure body 6.

In FIG. 9(a), the total reflection film 7c is provided on the diagonal plane of e.g. the cubic second mirror structure body 7. The input light 12 is incident vertically on the upper surface of the second mirror structure body 7, on which the antireflection film 7b is coated, and takes a bent of 90 degrees by the total reflection film 7c. Then, in the optical resonator constituted of the second mirror surface 7a and the first mirror surface 6a of the first mirror structure body 6 located facing to each other in parallel, the output light 14 resonated and filtered out thereby emits in the right direction of the first mirror structure body 6.

In FIG. 9(b), as is the case of FIG. 9(a), the input light 12 incident to the second mirror structure body 7 takes a bent of 90 degrees by the total reflection film 7c. Then, in the optical resonator constituted of the second mirror surface 7a and the first mirror surface 6a of the first mirror structure body 6 located facing to each other in parallel, the output light 14 resonated and filtered out thereby emits in the rear back direction of the figure (or the front direction of the figure) by the total reflection film 6c formed on the diagonal plane of the first mirror structure body 6.

In FIG. 9 (c), as is the case of FIG. 9 (a), in the optical resonator constituted of the second mirror surface 7a and the first mirror surface 6a of the first mirror structure body 6 located facing to each other in parallel, the output light 14 resonated and filtered out thereby is reflected by the total reflection film 6c of the first mirror structure body 6 and emits again in the upper direction.

However, in the cases of FIG. 8 (b), FIG. 8 (c), FIG. 9 (b) and FIG. 9 (c), when the first mirror structure body 6 is displaced in the plane direction along the moving direction 8 of the movable portion 2, the optical axis of the emitting output light 14 changes in accordance therewith. In such a case, a light accepting portion of e.g. the focusing lens 12 and the second optical fiber 16 explained by FIG. 7 is preferably mounted on the movable portion 2. Otherwise, a light accepting portion having a size of covering the range of the moving direction 8 may be mounted on the fixed portion 4.

In addition, the optical paths of the input light 12 and the output light 14 in the Fabry-Perot type tunable filter have possibly various kinds of features. For example, if the objective light is infrared rays, the feature is possibly that the input light 12 is incident on the reverse side of the SOI substrate 1. Otherwise, the feature is possibly that the output light 14 emits to the reverse side of the SOI substrate 1.

Furthermore, the optical paths of the input light 12 and the output light 14, with a structure where propagation thereof is in the reverse direction to the direction shown in FIG. 8 and FIG. 9 is applicable.

Moreover, a right angle prism can be employed instead of the mirror structure body having a diagonal plane of the cube. In this case, a material having a high refractivity and transparent to the objective light is selected in order that the total reflection may occur on the oblique surface of the right angle prism corresponding to the diagonal plane of the cube mentioned above.

Upon selecting appropriately the first mirror structure body 6, the second mirror structure body 7, the first mirror surface 6a and the second mirror surface 7a, the Fabry-Perot type tunable filter of this embodiment mentioned above is applicable to the objective light of a wide wavelength range from infrared rays to ultraviolet rays. Thus, an optical device combined and unified into the MEMS, which has various functions, can be easily manufactured.

For example, in the WDM optical transmission system using infrared rays as the objective light, the number of wavelengths of multiplexing can be greater than 10 as mentioned above, and a multi/demultiplexer, a modulator, a switch or router can be produced. Furthermore, in the case of visible light as the objective light, a spectrometer, an optical interferometer, or a laser resonator can be produced. In addition, in the case of ultraviolet rays as the objective light, a spectrometer, an interferometer and a laser resonator can be produced as well as the case of the visible light although the whole body of the Fabry-Perot type tunable filter must be under a depressed atmosphere in order to reduce the loss of optical transmission.

Moreover, in respect to the Fabry-Perot type tunable filter mentioned above, the comb-shaped electrostatic actuator is suitably employed as the actuator of the MEMS. Thus, low voltage driving therefor can be facilitated compared to a conventional tunable filter using a parallel plate type electrostatic actuator. In accordance, the MEMS component that combines and unifies the Fabry-Perot type tunable filter can be easily miniaturized. In this way, a route to realize a novel optoelectronics amalgamating the electronics with the photonics in future will be developed. Specifically, realization of the MEMS component integrating a semiconductor element and an optical element having the above-mentioned function monolithically on e.g. a silicon substrate will be accelerated.

Next, a fabrication method for the Fabry-Perot type tunable filter of this embodiment will be explained referring to FIGS. 10(a) to 10(f). FIG. 10 shows cross sectional views of main processes to explain the fabrication method thereof.

As shown in FIG. 10 (*a*), preparing the SOI substrate 1*c* comprising a supporting substrate 1*a* of 300 μm, an insulating layer 1*b* of 3 μm and the SOI layer of 50 μm in thickness respectively, the SOI layer 1*c* is processed in a predetermined pattern by means of well known photolithography technology and dry etching technology.

Because the thickness of the SOI layer 1*c* is about 50 μm, high anisotropic dry etching is carried out in the etching process of the SOI layer 1*c* using e.g. Deep Reactive Ion Etching (DRIE) of High Density Plasma (HDP) such as Inductively Coupled Plasma (ICP). As the first etching mask 21 in this case, a layered mask of e.g. an Al layer formed in the predetermined pattern and a photoresist layer having the predetermined pattern formed over the Al layer by photolithography technology is favorably used. Such layered mask can be easily formed, through the photoresist layer of the predetermined pattern formed by photolithography technology as a mask, upon transferring the pattern by carrying out etching process on the Al layer thereunder.

In the next place, the first etching mask 21 used for etching process of the SOI layer 1*c* is removed by asking of oxygen plasma and wet etching with chemical solution as shown in FIG. 10 (*b*). As mentioned above, predetermined patterns of such as the movable portion 2, the fixed portion 4, the movable side comb-teeth electrode 5*a* and the fixed side comb-teeth electrode 5*b* are formed on the SOI layer 1*c*. Patterns of e.g. the suspension supporting member 3, the projected portion 9, and the stopper portion 10 are also formed though they are not shown in FIG. 10 (*b*).

As shown in FIG. 10 (*c*), for example, photoresist is coated on the SOI layer 1*c* processed in the predetermined pattern, and then the whole thereof is covered with the passivation film 22. Then, the supporting substrate 1*a* is processed in the predetermined pattern through the well known photolithography technology and the dry etching technology.

As the thickness of the supporting substrate 1*a* is very thick, i.e. approximately 300 μm, the etching process is carried out by anisotropic dry etching using the DRIE of the HDP. For the second etching mask 23 in this case, a layered mask of e.g. an Al layer and a photoresist layer is used like the first etching mask 21. The second etching mask 23 is formed in alignment with the predetermined pattern formed on the SOI layer 1*c*. The opening part 24 is formed by etching process of the supporting substrate 1*a*. After formation of the opening part 24, the supporting substrate 1*a* is removed except the insulating layer 1*b* under the pattern regions of the movable portion 2, the suspension supporting member 3, the movable side comb-teeth electrode 5*a*, the fixed side comb-teeth electrode finger group 51*b*, the projected portion 9, the stopper portion 10, etc.

As shown in FIG. 10 (*d*), the second etching mask 23 used for etching process of the supporting substrate 1*a* is removed by the same method as that for removing the first etching mask 21. After the second etching mask has been removed, the insulating layer 1*b* exposed in the region of the opening part 24 is removed by wet etching using the remaining passivation film 22 and the supporting substrate 1*a* of the predetermined pattern.

As shown in FIG. 10 (*e*), the remaining passivation film 22 is removed by asking or exfoliation using chemical liquid. Thus, the movable portion 2, the fixed portion 4, the movable side comb-teeth electrode 5*a*, the fixed side comb-teeth electrode 5*b*, etc. are patterened on the SOI layer 1*c*. In addition, the suspension supporting member 3, the projected portion 9, the stopper portion 10, etc. are formed in the same way though they are not shown in the figure.

As shown in FIG. 10 (*f*) in the next place, the first mirror structure body 6 is bonded to the predetermined position on the surface of the movable portion 2 with, for example, a UV-cured type adhesive. In the same way, the second mirror structure body 7 is bonded to the corresponding position on the surface of the fixed portion 4 with a UV-cured type adhesive. Here, the bonding is carried out in order that the first mirror surface 6*a* of the first mirror structure body 6 and the second mirror surface 7*a* of the second mirror structure body 7 may be located facing to each other in parallel.

For the bonding of the first mirror structure body 6 and the second mirror structure body 7, it may be carried out on the surface of the movable portion 2 and the surface of the fixed portion 4 respectively on the condition that the first mirror surface 6*a* and the second mirror surface 7*a* come into contact with each other. Alternatively, for example, on the condition that a spacer (not shown in the figure) of a predetermined thickness is interposed between the first mirror surface 6*a* and the second mirror surface 7*a*, the first mirror structure body 6 and the second mirror structure body 7 are bonded to the surface of the movable portion 2 and the surface of the fixed portion 4 respectively. Then, after the bonding, the spacer mentioned above is removed.

In the former bonding method of the mirror structure bodies, it is necessary that a voltage higher than the usual operating voltage for the comb-teeth type electrostatic actuator should be temporarily applied between the movable side comb-teeth electrode 5*a* and the fixed side comb-teeth electrode 5*b* in order to detach the first mirror surface 6*a* from the second mirror surface 7*a*, both thereof being so far tightly adhered together. To the contrary, in the latter bonding method using a spacer, a predetermined gap is formed between the first mirror surface 6*a* and the second mirror surface 7*a* after the spacer has been removed. Consequently, it is not necessary that a temporary high voltage is applied between the movable side comb-teeth electrode 5*a* and the fixed side comb-teeth electrode 5*b* like the former bonding method.

For this spacer, a thermo-sublimate organic film such as polyoxyalkilene resin is stuck on either the first mirror surface 6*a* or the second mirror surface 7*a*, and then the spacer may be sublimated and removed by heat treatment of approximately 200 after the bonding mentioned above. Alternately, using a photoresist film as the spacer, it can be removed by asking.

As mentioned above, a gap of a certain width is formed between the first mirror surface 6*a* and the second mirror surface 7*a* on the condition that no voltage is applied between the movable side comb-teeth electrode 5*a* and the fixed side comb-teeth electrode 5*b*, and that the comb-teeth type electrostatic actuator is not driven. The gap formed between the first mirror surface 6*a* and the second mirror surface 7*a* on the condition that the actuator does not operate like this is hereafter called 'initial gap'. In addition, the method for forming such initial gap is designated as 'initial gap forming mechanism'. When the initial gap is formed by means of the spacer of the above-mentioned organic film, the width of the initial gap corresponds to the thickness of the spacer, e.g. about 1 μm to 2 μm.

Moreover, a thin film electrode constituting a capacitance type displacement sensor can be formed on a predetermined position of the part of the first mirror surface 6*a* and the second mirror surface 7*a* where a light does not pass through. Then, in operation of the Fabry-Perot type tunable filter as mentioned above, change of the distance L can be sensed upon monitoring the capacitance between these thin film electrodes.

Furthermore, as shown in FIG. 10 (*f*), the first conductive layer 25 is deposited on a predetermined position of the movable side comb-teeth electrode 5*a* and the movable portion 2, and the second conductive layer 26 is deposited on the fixed side comb-teeth electrode 5*b* by sputtering method, as the conductive layer of e.g. Al. These conductive layers serve as electrode pads and are bonded to external terminals with wires respectively (not shown in the figure) for voltage supplying.

By using the SOI substrate as mentioned above, the Fabry-Perot type tunable filter explained by referring to FIG. 1 to FIG. 9 can be fabricated quite easily and stably. The Fabry-Perot type tunable filter of this embodiment can also be fabricated on any substrate other than the SOI substrate.

The Second Embodiment

Figure 11:
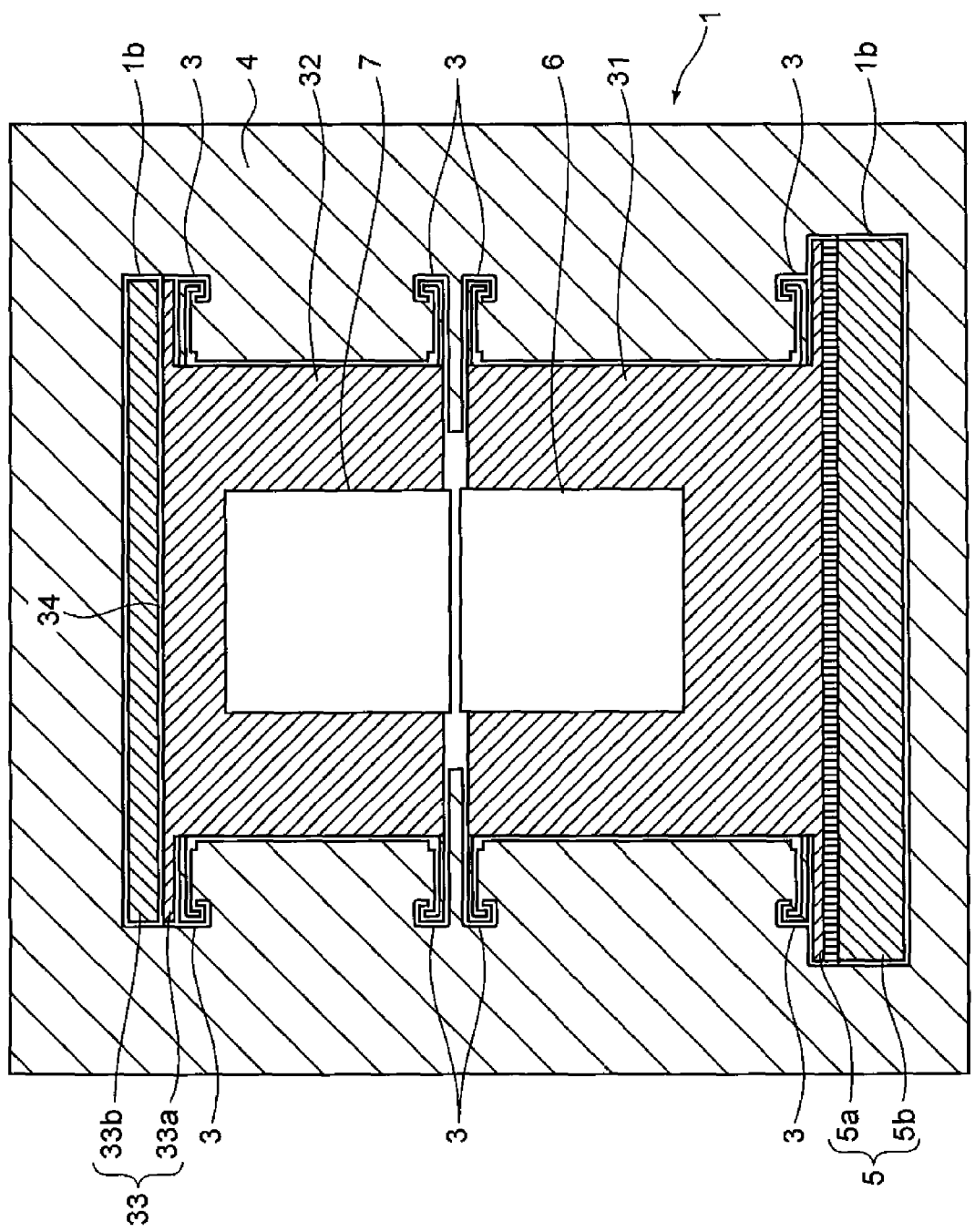
FIG. 11 is a plan view showing an example of the Fabry-Perot type tunable filter according to the second embodiment of the present invention.
Figure 12A:
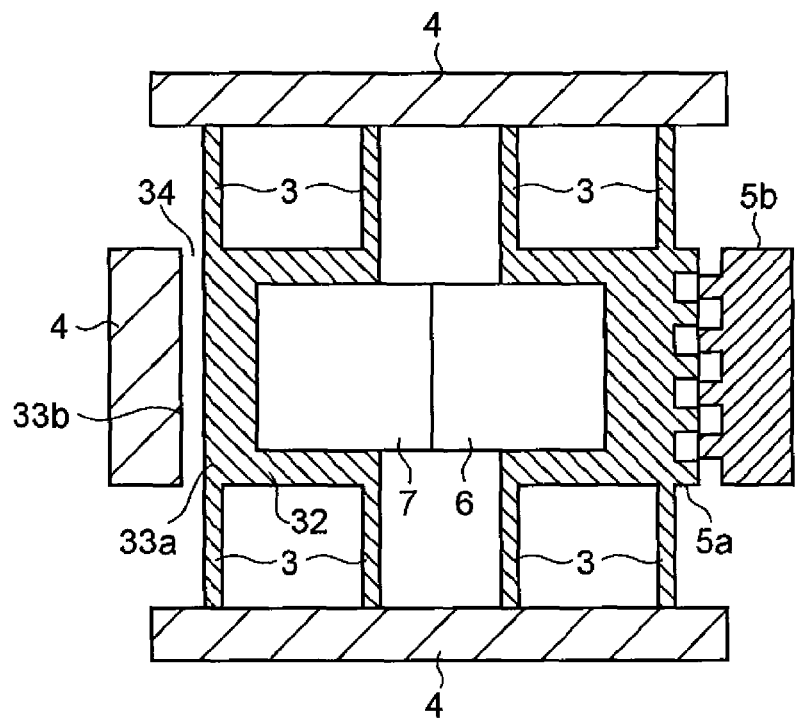
FIGS. 12(a) to 12(b) are a pattern diagram showing a process of fabrication of the Fabry-Perot type tunable filter according to the second embodiment of the present invention, where
Figure 12B:
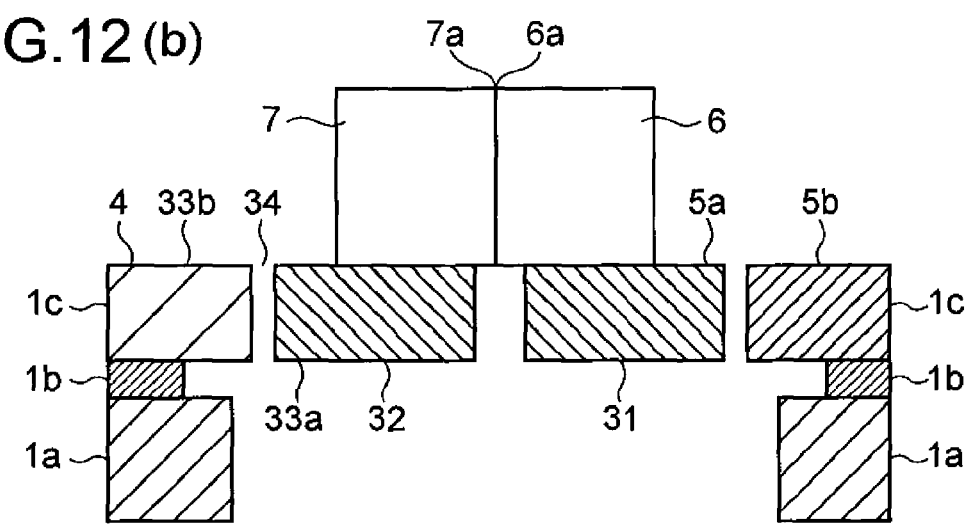
Figure 13A:
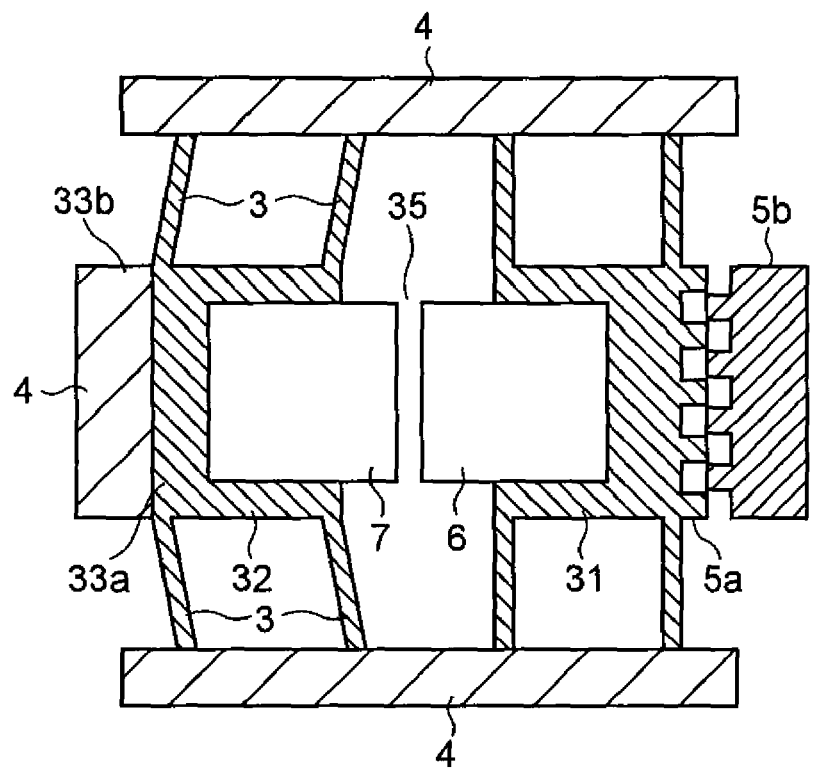
FIGS. 13(a) to 13(b) are a pattern diagram showing a process following FIG. 2, where
Figure 13B:
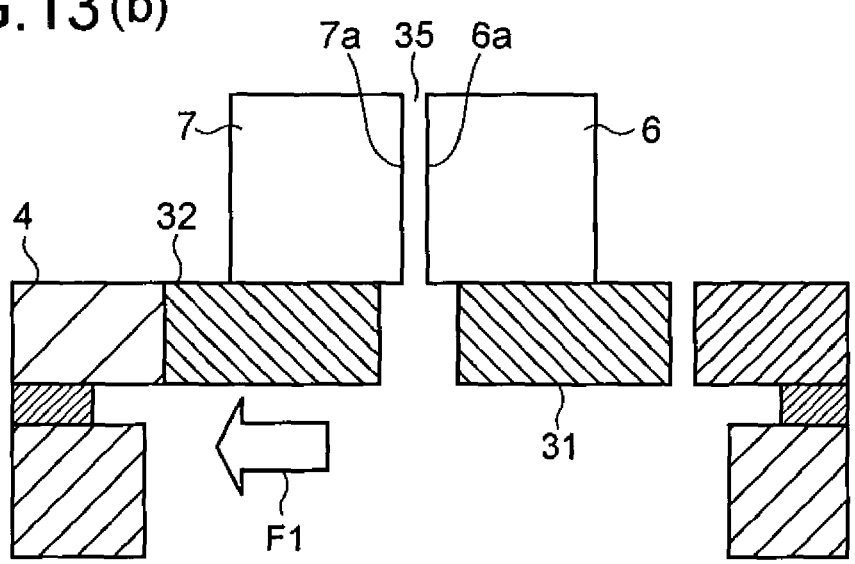

Referring to FIG. 11 to FIG. 13, the Fabry-Perot type tunable filter of the second embodiment of the present invention will be explained. The feature of the Fabry-Perot tunable filter of this embodiment is that the width of the initial gap between the first mirror surface 6*a* and the second mirror surface 7*a* explained in the first embodiment can be made large by utilizing the electrostatic attractive force between the electrodes. Here, FIG. 11 is a plan view showing schematically a Fabry-Perot type tunable filter. FIG. 12 and FIG. 13 are a plan view and a cross sectional view respectively showing typically the assembling method of the first mirror structure body 6 and the second mirror structure body 7 of the Fabry-Perot type tunable filter in the MEMS.

In this case, an example in which the SOI substrate 1 is employed as one substrate like the first embodiment will be also explained. Hereinafter, a fabrication method for the Fabry-Perot type tunable filter relating to this embodiment will be explained, where the structure of the Fabry-Perot type tunable filter will be demonstrated.

In the Fabry-Perot type tunable filter of this embodiment, the first movable portion 31 and the second movable portion 32 of e.g. rectangle are formed on the SOI layer 1*c* by processing the SOI substrate 1 using photolithography technology and dry etching technology just as is explained in FIG. 10 (*a*) to FIG. 10 (*e*) of the first embodiment. Here, the first movable portion 31 and the second movable portion 32 are arranged in parallel with each other in a predetermined region of the SOI layer 1*c* in the SOI substrate as shown in FIG. 11, and can move in the same plane direction parallel to the substrate. In addition, these movable portions are supported elastically and movably by the suspension supporting members 3 formed in processing of the SOI substrate mentioned above at e.g. 4 points respectively.

The comb-teeth shaped electrostatic actuator, which drives the first movable portion 31 in the plane direction, is formed as an actuator just as is shown in the first embodiment. For the comb-teeth electrode 5 constituting the comb-teeth type electrostatic actuator, the movable side comb-teeth electrode 5*a* formed integrally on a side of the first movable portion 31 and the fixed side comb-teeth electrode 5*b* secured to a predetermined position of the fixed portion 4 are formed facing to each other.

Additionally, the parallel plane electrode 33 for connecting one side of the second movable portion 32 to the fixed portion 4 is arranged so as to be parallel to e.g. the comb-teeth electrode 5 in the SOI layer 1*c* as described later. The parallel plane electrode 33 is formed in such a manner that the movable side parallel plane electrode 33*a* formed integrally on the second actuator 32 and the fixed side parallel plane electrode 33*b* secured to the predetermined position of the fixed portion 4 are located facing to each other.

The fixed side parallel plane electrode 33*b* is formed on the fixed portion 4 along and facing to one side of the second movable portion 32. The fixed side parallel plane electrode 33*b* is formed by processing the SOI layer 1*c* of the predetermined position of the fixed portion 4 in a predetermined pattern. The periphery thereof is determined by etching removal of the SOI layer 1*c*, so that the supporting substrate 1*a* and the insulating layer 1*b* will remain. A side of the movable side parallel plane electrode 33*a* and a side of the fixed side parallel plane electrode 33*b*, which are facing to each other, make the predetermined gap 34 between them. In the etching process of the SOI layer 1*c*, the width of the gap 34 is set to be approximately 2 μm to 10 μm.

As is explained in the first embodiment, a conductive layer of e.g. Al (not shown in the figure) is deposited on the predetermined positions of the movable side parallel plane electrode 33*a* and the fixed side parallel plane electrode 33*b* along with the predetermined position of the first movable portion 31 and a necessary position of the comb-teeth electrode 5. These conductive layers serve as electrode pads and are bonded to external terminals with wires respectively (not shown in the figure) for voltage supplying.

As shown in FIGS. 12(*a*) to 12(*b*), the first mirror structure body 6 and the second mirror structure body 7 are bonded to the first movable portion 31 and the second movable portion 32 respectively with an adhesive of e.g. UV-cured type. Here, the first mirror surface 6*a* and the second mirror surface 7*a* are set to come into contact with each other. The first mirror structure body 6 and the second mirror structure body 7 are those explained in the first embodiment, and materials and shapes thereof are appropriately selected in accordance with the objective light.

As shown in FIGS. 13(*a*) to 13(*b*), a predetermined voltage is applied between e.g. the movable side parallel plane electrode 33*a* and the fixed side parallel plane electrode 33*b* to contact these facing sides together through the electrostatic attractive force F1, and the second movable portion 32 is connected to the fixed portion 4 to be secured thereto. If the facing end surfaces of the movable side parallel plane electrode 33*a* and the fixed side parallel plane electrode 33*b* are made of silicon of the SOI layer 1*c*, contacting can be maintained even if the voltage applying is released after the bonding, but the facing end surfaces are preferably connected fixed completely with an adhesive.

By connecting the second movable portion 32 to the fixed portion 4, the first mirror surface 6*a* and the second mirror surface 7*a*, which have come into contact with each other, are separated from each other, and the above-mentioned initial gap 35 of approximately the same width as the gap 34 is formed. The width of the initial gap 35 can be easily prepared to be about 2 μm to 10 μm.

By means of such mechanism, the first mirror structure body 6 bonded to the surface of the first movable portion 31 and the second mirror structure body 7 secured to the fixed portion 4 are formed. The first mirror surface 6*a* formed on the first mirror structure body 6 and the second mirror surface 7*a* formed on the second mirror structure body 7 are located in parallel with and facing to each other so as to constitute an optical resonator. On the condition that the actuator is not operating, the initial gap of the predetermined gap is formed.

Operation of the Fabry-Perot type tunable filter formed like the above is the same as that explained in the first embodiment. For the above-mentioned Fabry-Perot tunable filter, the width of the initial gap 35 is determined by the gap formed by etching process of the SOI layer 1*c*. Therefore, if there is a fabricating dispersion in the etching process, a deviation corresponding thereto will occur on the width of the initial gap 35. In consequence, on operation by driving of the comb-teeth type electrostatic actuator, it is suitable that a bias adjustment should be given to the voltage value of the comb-teeth electrode 5 in accordance with the deviation of the width of the initial gap 35.

According to this embodiment, the width of the initial gap 35 can be wider than the case of the first embodiment. Therefore, in the operation of the Fabry-Perot type tunable filter, mutual contact between the first mirror surface 6a and the second mirror surface 7a completely disappears. In consequence, temporary high voltage applying to the comb-teeth electrode 5 when the contact occurs is not necessary. Accordingly, the effect just as is explained in the first embodiment can be achieved.

The Third Embodiment

Figure 14:
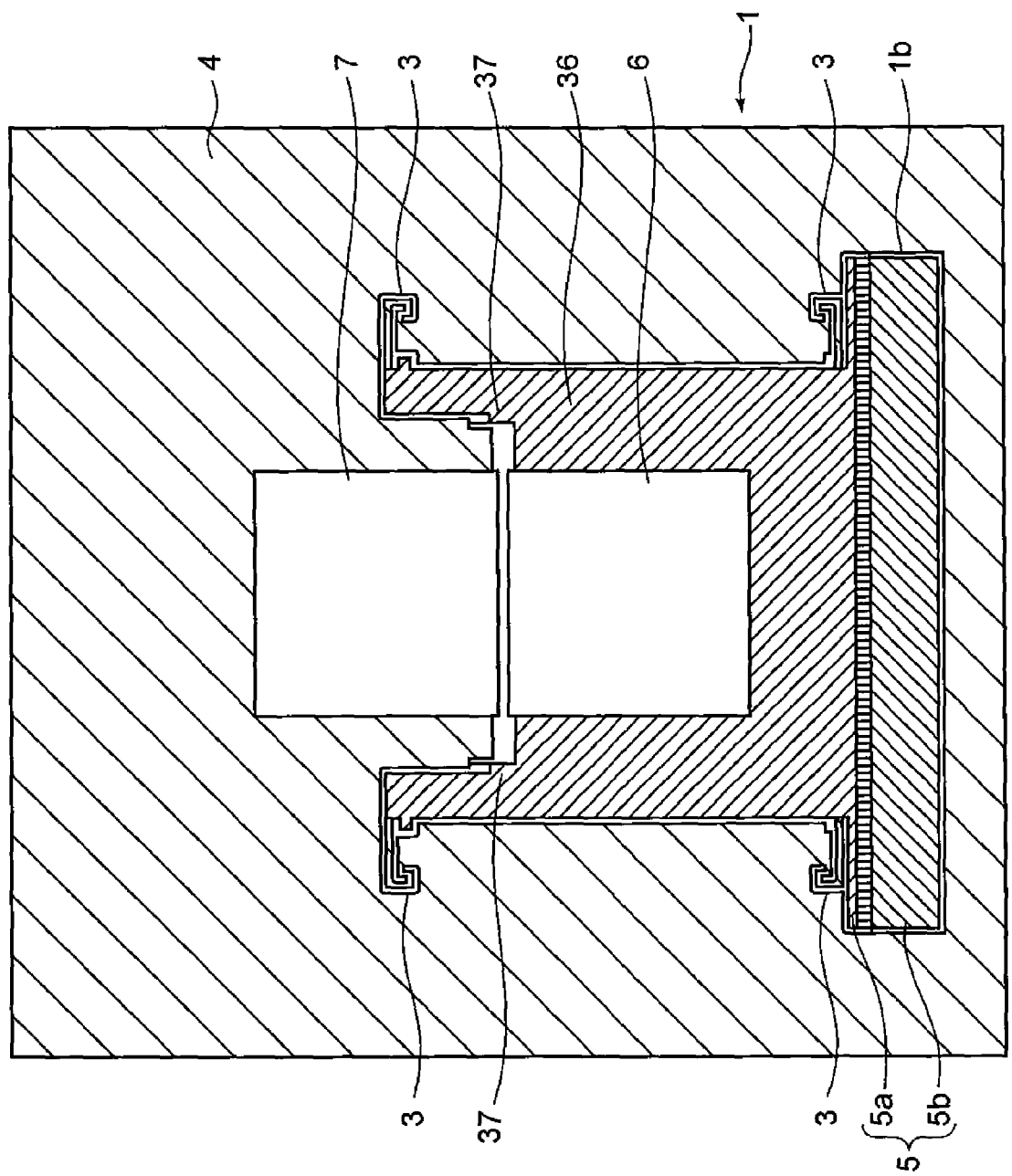
FIG. 14 is a plan view showing an example of the Fabry-Perot type tunable filter according to the third embodiment of the present invention.
Figure 15:
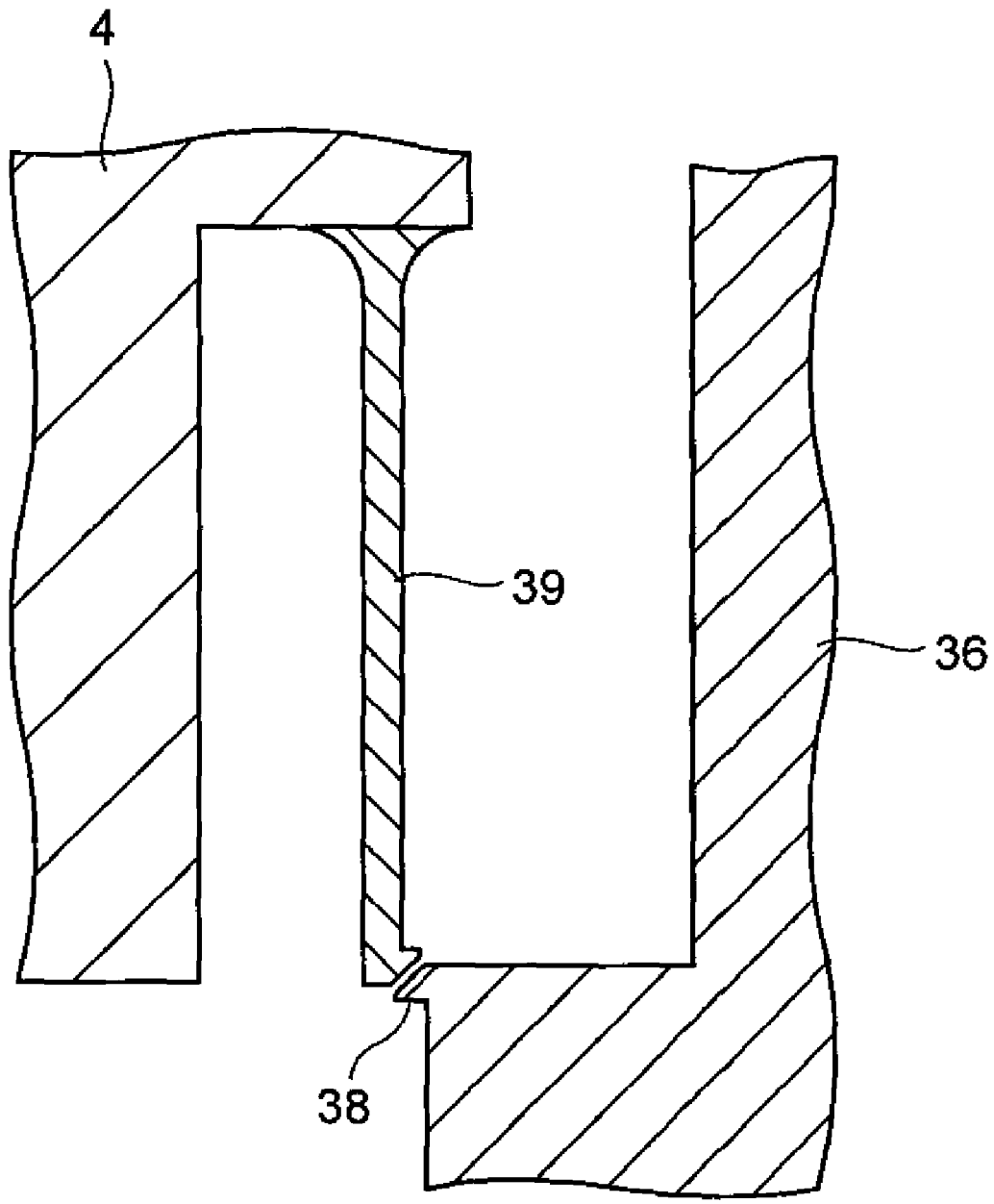
FIG. 15 is a magnified diagram showing an example of the hook mechanism of the Fabry-Perot type tunable filter according to the third embodiment of the present invention.

The third embodiment of the present invention will be explained referring to FIG. 14 to FIG. 19. The feature of the Fabry-Perot type tunable filter according to this embodiment is that the width of the initial gap can be widened upon forming the initial gap between the first mirror surface 6a and the second mirror surface 7a explained in the first embodiment with a hook mechanism. FIG. 14 is a plan view showing schematically an example of the Fabry-Perot type tunable filter. FIG. 15 is a partially magnified view for explaining the hook mechanism. FIG. 16(a) to FIG. 19(b) are plan views and cross sectional views thereof typically showing the attaching method of the first mirror structure body 6 and the second mirror structure body 7 of the Fabry-Perot tunable filter in the MEMS.

In this case, an example in which the SOI substrate 1 is employed as one substrate like the first embodiment will be also explained. Hereinafter, a fabrication method for the Fabry-Perot type tunable filter relating to this embodiment will be explained, where the structure of the Fabry-Perot type tunable filter will be demonstrated.

In the Fabry-Perot type tunable filter of this embodiment, the movable portion 36 of e.g. rectangle movable in the plane direction is formed on the SOI layer 1c as shown in FIG. 14 by processing the SOI substrate 1 using photolithography technology and dry etching technology just as is explained in FIG. 10 (a) to FIG. 10 (e) of the first embodiment. Here, the movable portion 36 is supported by elastically and movably by the suspension supporting members 3 formed in processing of the SOI substrate mentioned above at e.g. 4 points.

As shown in FIG. 14, the hook mechanism 37 is formed on plural positions (2 positions for FIG. 14) between the movable portion 36 and the fixed portion 4. The hook mechanism 37 is, as shown in FIG. 15, comprised of e.g. the first claw 38 provided on the movable portion 36 and the second claw 39 formed with a predetermined part of the fixed portion 4 as the fixed end thereof. Though explained later, these claws engage and catch each other.

As is shown in the first and second embodiments, the comb-teeth shaped electrostatic actuator, which shifts the movable portion 36 in the plane direction, is mounted as an actuator.

Figure 16:
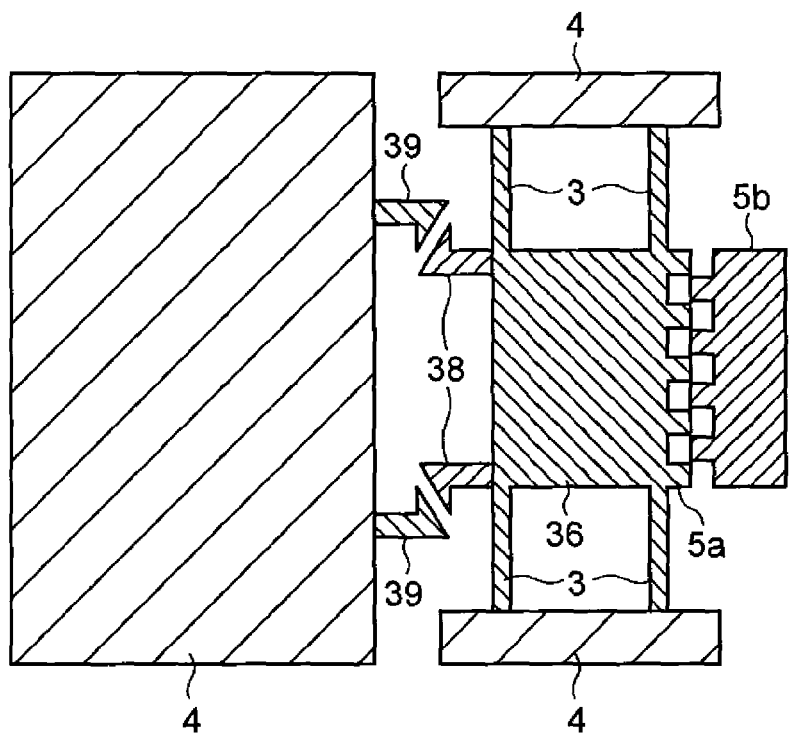
FIGS. 16(a) to 16(b) are a pattern diagram showing a process of fabrication for the Fabry-Perot type tunable filter according to the third embodiment of the present invention, where
Figure 16:
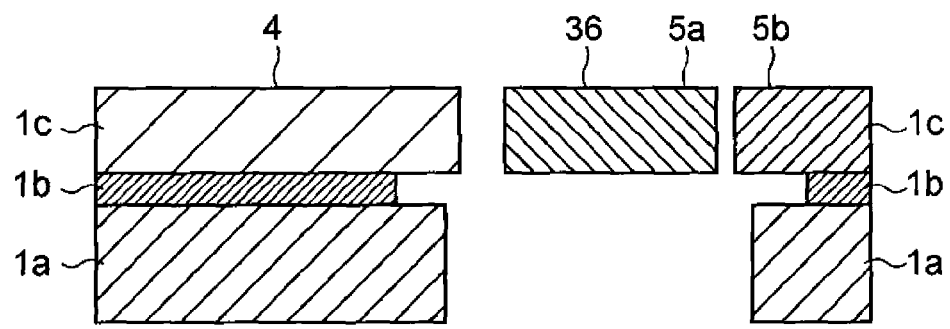

As shown in FIG. 16, a pair of the first claws 38 is formed on one side of the movable portion 36 so that it may confront the second claw 39. Additionally, the movable side comb-teeth electrode 5a and the fixed side comb-teeth electrode 5b of the comb-teeth type electrostatic actuator are formed to be located facing to each other.

Figure 17A:
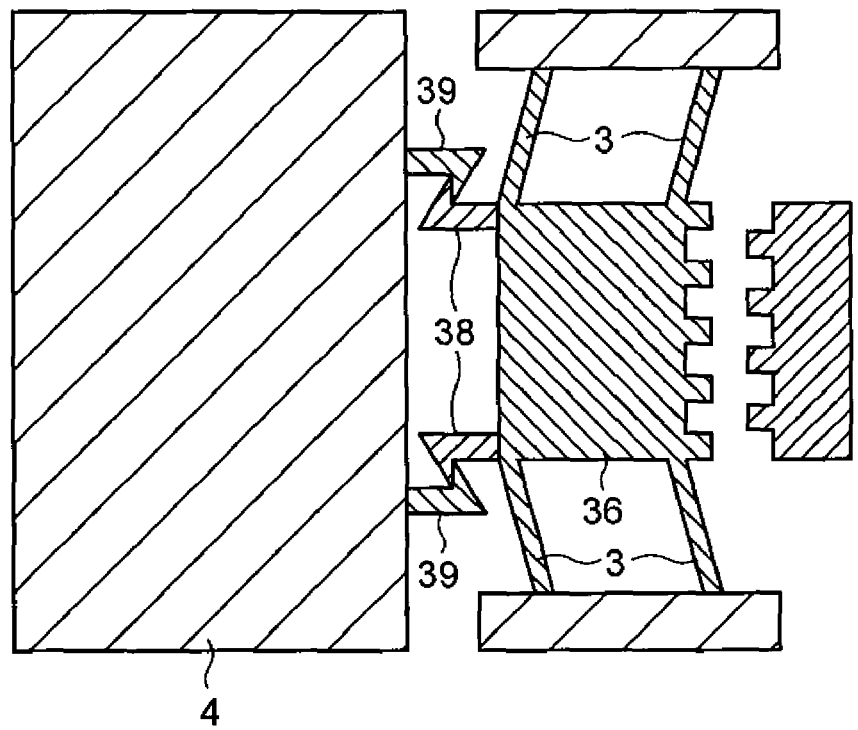
FIGS. 17(a) to 17(b) are a pattern diagram showing the process following FIG. 16, where
Figure 17B:
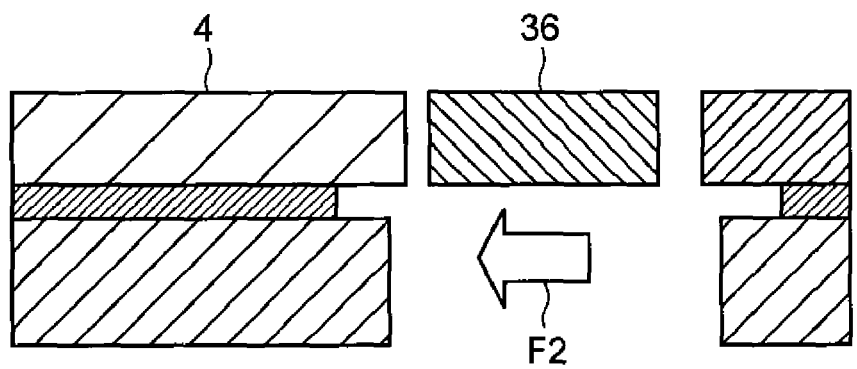

As shown in FIGS. 17(a) and 17(b), the movable portion 36, which is supported by the suspension supporting member 3 in an elastically movable manner, is moved by an appropriate distance by the aid of e.g. an external force of a manipulator in such a manner that a pair of the first claws 38 can catch the corresponding second claws 39 respectively.

Figure 18A:
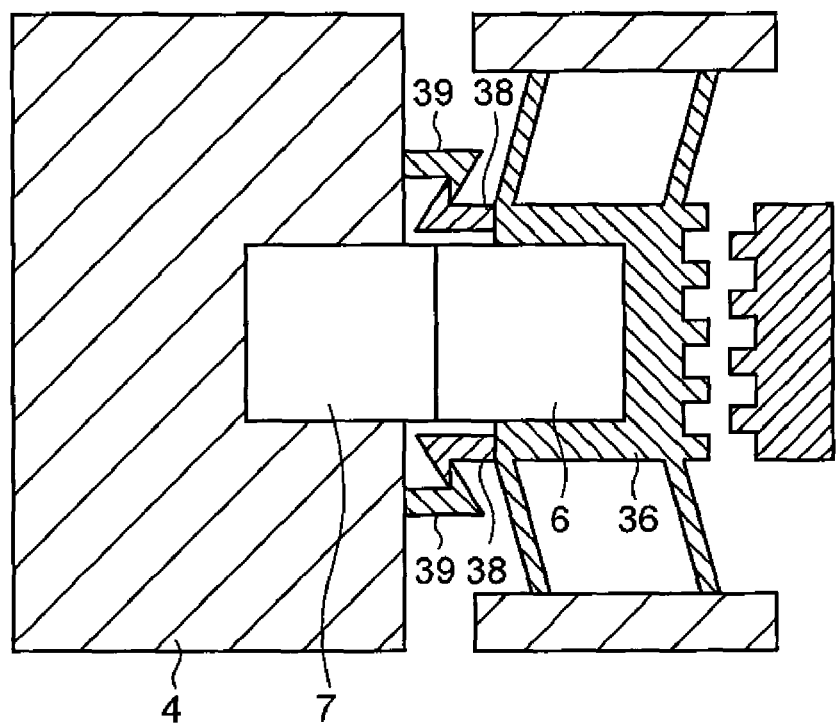
FIGS. 18(a) to 18(b) are a pattern diagram showing the process following FIG. 17, where
Figure 18B:
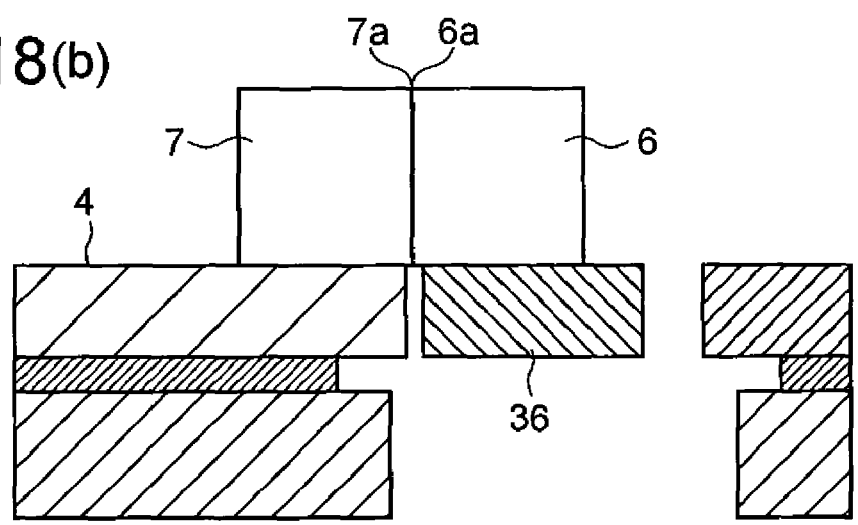
Figure 19:
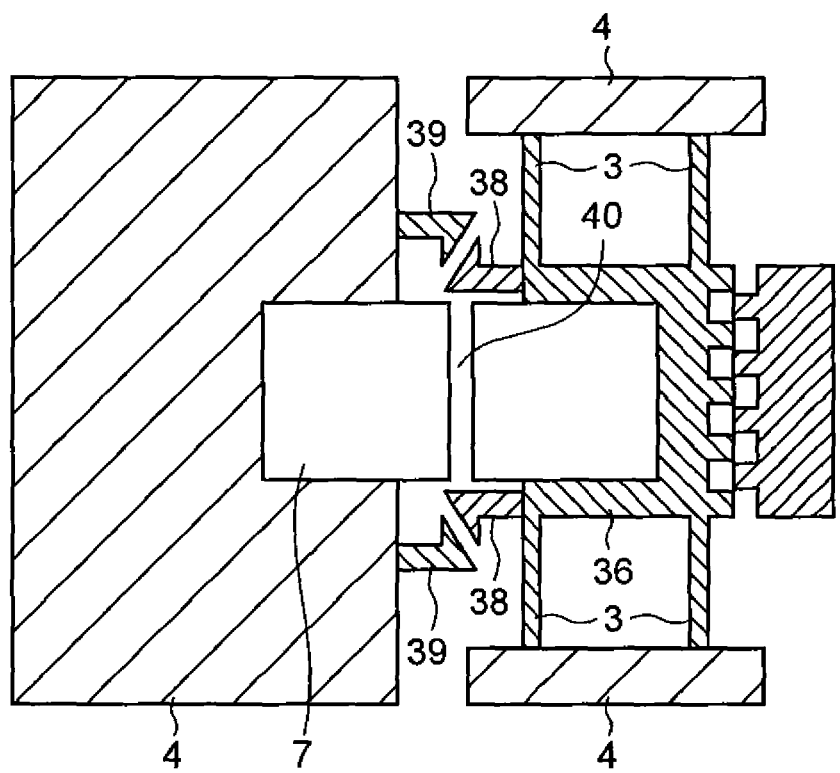
FIG. 19 is a pattern diagram showing the process following FIG. 18, where
Figure 19:
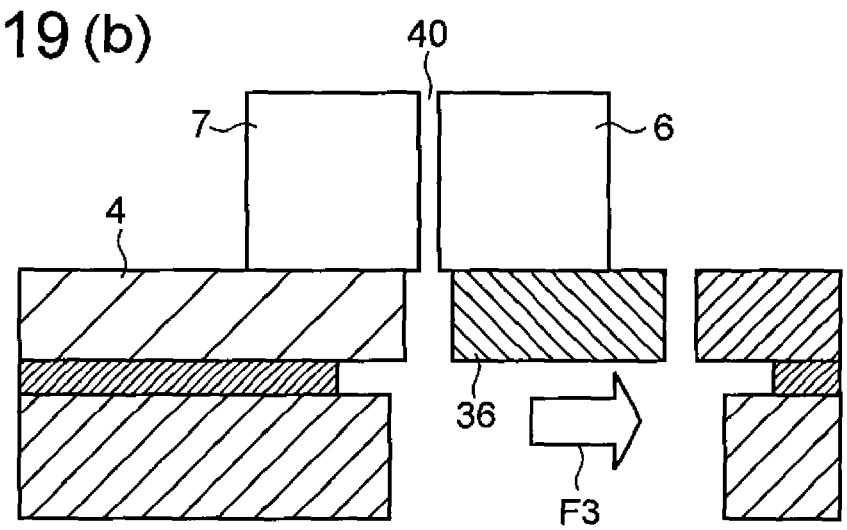

Then, in FIGS. 18(a) and 18(b), the first mirror structure body 6 and the second mirror structure body 7 are bonded to the predetermined positions of the movable portion 36 and the fixed portion 4 respectively by means of e.g. a UV-cured type adhesive. Here, the first mirror surface 6a and the second mirror surface 7a are set to come into contact with each other. The first mirror structure body 6 and the second mirror structure body 7 are the same as those explained in the first embodiment.

As shown in FIGS. 19(a) and 19(b), as for the pair of the first claws 38 of the movable portion 36, a catch with each corresponding second claw 39 is released by, for example, a manipulator. The resilience F3 of the suspension supporting member 3 acts by the release of this catch, and the movable portion 36 returns to the original position. In consequence, the first mirror surface 6a and the second mirror surface 7a, which have come into contact with each other, are separated, so that the initial gap 40 comes to be formed.

Thus, the optical resonator having the following features is produced. That is, it has the initial gap 40 on the condition that the actuator is not working, and the first mirror surface 6a of the first mirror structure body 6 bonded to the surface of the movable portion 36 and the second mirror surface 7a of the second mirror structure body 7 bonded to the surface of the fixed portion 4 are located facing to each other in parallel. The operation of the Fabry-Perot type tunable filter formed like this is quite the same as is explained in the first embodiment.

According to this embodiment, the width of the initial gap 40 can be widened compared to the case of the first embodiment. Accordingly, the effect just as is explained in the second embodiment can be achieved.

The Fourth Embodiment

Figure 20:
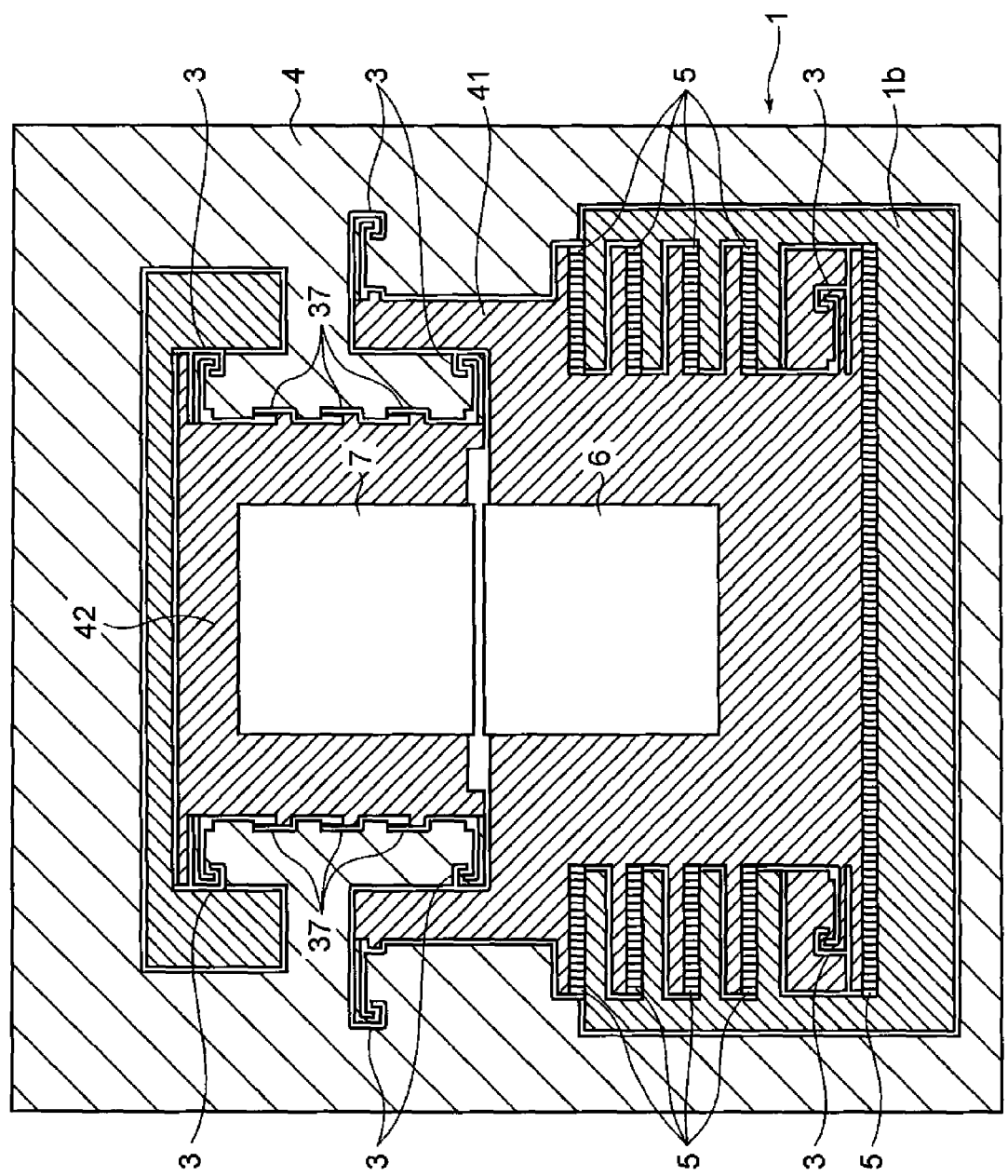
FIG. 20 is a plan view showing an example of the Fabry-Perot type tunable filter according to the fourth embodiment of the present invention.
Figure 21:
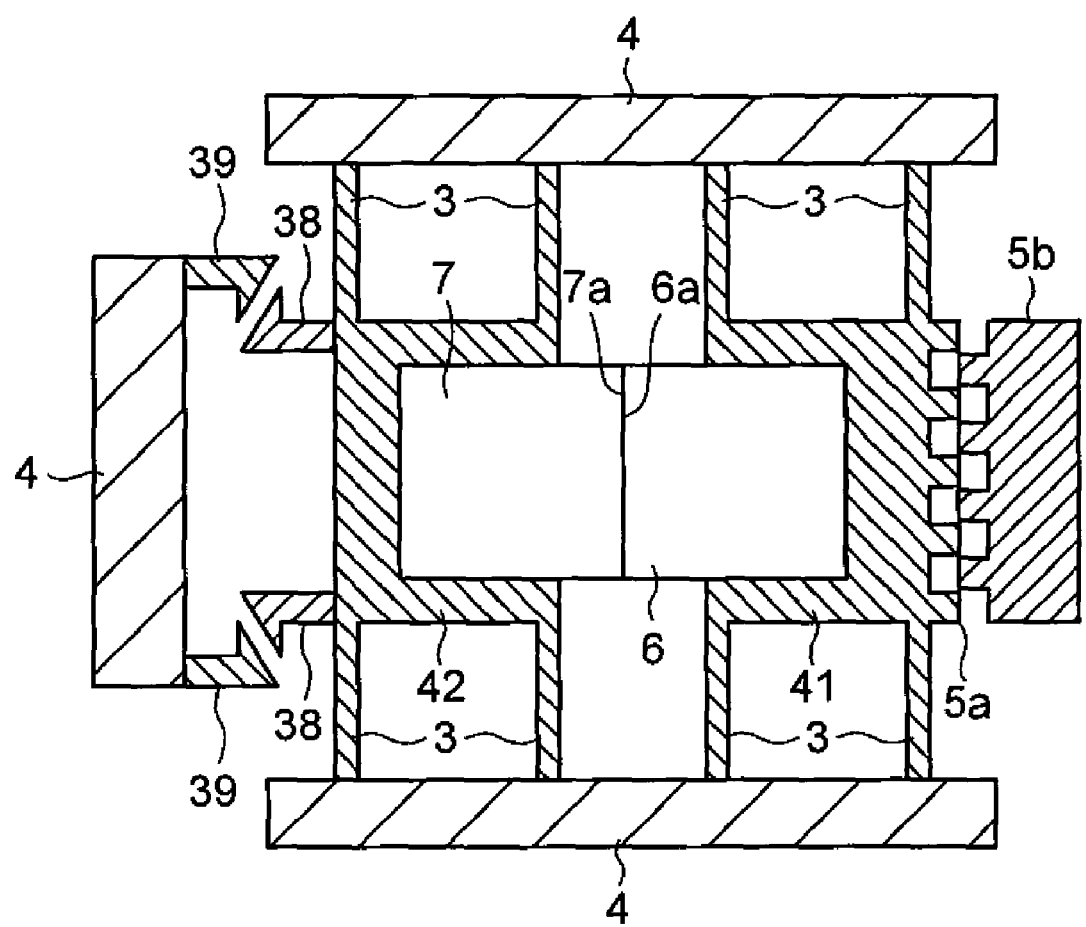
FIG. 21 is a pattern plan view showing a process of fabrication for the Fabry-Perot type tunable filter according to the fourth embodiment of the present invention.
Figure 22:
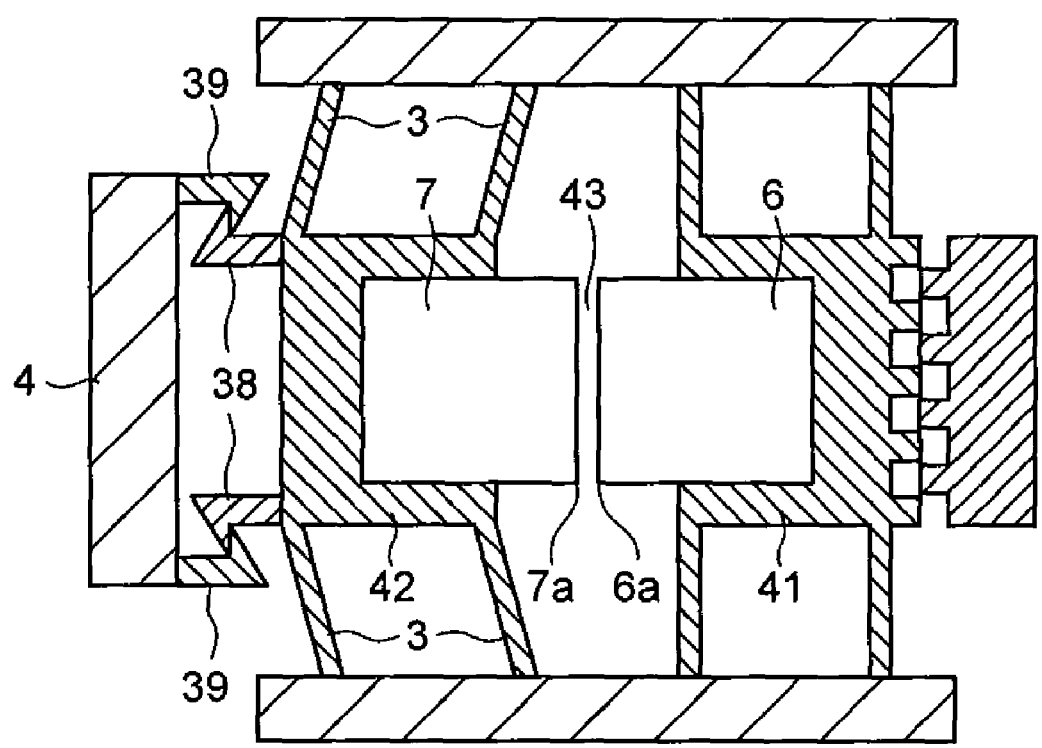
FIG. 22 is a pattern diagram showing the process following FIG. 21.

Referring to FIG. 20 to FIG. 22, the fourth embodiment of the present invention will be explained. The Fabry-Perot type tunable filter of this embodiment features that the initial gap between the first mirror surface 6a and the second mirror surface 7a can be formed by means of a catch by a hook mechanism instead of the electrostatic attractive force of the parallel plane electrode 33 in the Fabry-Perot type tunable filter explained in the second embodiment. FIG. 20 is a plan view schematically showing one example of the Fabry-Perot type tunable filter. FIG. 21 and FIG. 22 are plan views typically showing a mounting method of the first mirror structure body 6 and the second mirror structure body 7 of the Fabry-Perot type tunable filter in the MRMS.

An example employing the SOI substrate 1 as one substrate will also be explained in this case like the first embodiment. Hereinafter, a fabrication method for the Fabry-Perot type tunable filter relating to this embodiment will be explained, where the structure of the Fabry-Perot type tunable filter will be demonstrated.

In the Fabry-Perot type tunable filter of this embodiment, the first movable portion 41 and the second movable portion 42 of e.g. rectangular shaped respectively movable in the plane direction are formed on the SOI layer 1c as shown in FIG. 14 by processing the SOI substrate 1 using photolithography technology and dry etching technology as is explained in FIG. 10 (a) to FIG. 10 (e) of the first embodiment. As shown in FIG. 20, the first movable portion 41 and the second movable portion 42 are located in parallel to each other on predetermined positions of the SOI layer 1c in the SOI substrate 1 and movable in the same plane direction. Furthermore, these movable portions are elastically supported at e.g. 4 points in a movable manner by the suspension supporting member 3 patterned in the process of the SOI substrate mentioned above.

In addition, the hook mechanisms 37 are formed on plural positions (6 positions for FIG. 6) between the second movable portion 42 and the fixed portion 4 as shown in FIG. 20. The fundamental structure of the hook mechanism is the same as that explained by FIG. 15, which is constituted of the first claw 38 provided on the second movable portion 42 and the second claw 39 formed with a predetermined part of the fixed portion 4 as the fixed end thereof.

Then, the comb-teeth type electrostatic actuator moving the first movable portion 41 in the plane direction is mounted as an actuator. As shown in FIG. 20, in the comb-teeth electrode 5 constituting the comb-teeth type electrostatic actuator, a plurality of the movable side comb-teeth electrodes 5a integrally formed so as to surround the periphery of the first movable portion 41 and a plurality of the fixed side comb-teeth electrodes 5b on plural points of the fixed portion 4 corresponding thereto are arranged so as to face respective movable electrodes.

As shown in FIG. 21, the first mirror structure body 6 and the second mirror structure body 7 are bonded to the first movable portion 41 and the second movable portion 42 respectively by using an adhesive of e.g. UV-cured type. Here, the first mirror surface 6a and the second mirror surface 7a are set to come into contact with each other.

As shown in FIG. 22, the second movable portion 42 supported elastically and movably by the suspension supporting member 3 is shifted by an appropriate distance by means of e.g. a manipulator, and a pair of claws 38 are caught by the corresponding second claws 39 respectively. Due to the catching, the first mirror surface 6a and the second mirror surface 7a, which have contacted with each other, are separated and the initial gap 43 is formed.

Thus, the first mirror structure body 6 bonded to the surface of the first movable portion 41 and the second mirror structure body 7 bonded to the second movable portion 42 caught by the fixed portion 4 are faced. Then, the optical resonator having the following features is formed. That is, it has the initial gap 40 on the condition that the actuator is not working, and the first mirror surface 6a of the first mirror structure body 6 and the second mirror surface 7a of the second mirror structure body 7 are located facing to each other in parallel. Operation of the Fabry-Perot type tunable filter formed like the above is the same as that explained in the first embodiment.

In this embodiment, the comb-teeth electrode of the comb-teeth type electrostatic actuator is constituted of a plurality of movable side comb-teeth electrodes 5a formed along the periphery of the first movable portion 41 and a plurality of fixed side comb-teeth electrodes 5b located corresponding to each movable electrode. Therefore, the first movable portion 41 can be actuated at a low voltage. The effect thereof is quite the same as that explained in the second embodiment.

Though some preferred embodiments have been explained heretofore, the embodiments mentioned above do not restrict the present invention. In the specific embodiment, those skilled in the art can add various modifications or changes without any departure from the technological thinking and the technical region of the present invention.

In the embodiment mentioned above, the structure of the Fabry-Perot type tunable filter is that the distance between the first mirror surface 6a and the second mirror surface 7a is widened and the resonating length of the optical resonator becomes lengthened when the voltage applied to the comb-teeth electrode 5 is raised and the electrostatic attractive force is increased. The present invention is not limited to the structures like the above. A structure of the Fabry-Perot type tunable filter having the following features can be acceptable: i.e. the distance between the first mirror surface 6a and the second mirror surface 7a narrows and the resonating length of the optical resonator shortens when the voltage of the comb-teeth electrode 5 is raised.

What is claimed is:

1. A Fabry-Perot type tunable filter comprising;
a movable portion shifting in a plane direction parallel to a surface of one substrate,
a suspension supporting member movably supporting the movable portion,
an actuator making the movable portion shifted in the plane direction,
a fixed portion secured to the substrate,
a first mirror structure body having a first mirror surface formed by being bonded to the surface of the movable portion,
a second mirror structure body having a second mirror surface formed by being bonded to the surface of the fixed portion, and
an optical resonator constituted by the first mirror surface and the second mirror surface located face to face spaced to each other in parallel, a resonating length of the optical resonator controlled by means of a distance between the mirror surfaces through operation of the actuator.

2. The Fabry-Perot type tunable filter as set forth in claim 1, wherein the actuator is provided with an initial gap forming mechanism forming an initial gap to be a gap between the mirror surfaces on the condition that the actuator is not operating.

3. The Fabry-Perot type tunable filter as set forth in claim 2, wherein the initial gap forming mechanism has a structure to release catching of the movable portion and the fixed portion.

4. The Fabry-Perot type tunable filter as set forth in claim 1, wherein both mirror surfaces are aligned substantially perpendicular to the surface of the substrate.

5. The Fabry-Perot type tunable filter as set forth in claim 1, wherein the actuator comprises a comb-teeth electrostatic actuator.

6. A Fabry-Perot type tunable filter comprising;
one substrate having a first movable portion and a second movable portion both thereof shifting independently to each other in a plane direction parallel to a surface of the substrate,
a suspension supporting member movably supporting the movable portions respectively in a movable manner,
a fixed portion secured to the substrate,
an actuator making the first movable portion shifted in the plane direction,
a first mirror structure body having a first mirror surface and bonded to the surface of the first movable portion, and
a second mirror structure body having a second mirror surface and bonded to the surface of the second movable portion, and
an initial gap forming mechanism securing the second movable portion to the fixed portion to form an initial gap as a gap between the first mirror surface and the second mirror surface both thereof being located face to face to each other on a condition that the actuator is not operating, and an optical resonator comprising the first mirror surface and the second mirror surface, a resonating length of the optical resonator changed by a distance between the mirror surfaces being controlled through operation of the actuator.

7. The Fabry-Perot type tunable filter as set forth in claim 6, wherein the initial gap forming mechanism has a structure connecting the second movable portion with the fixed portion through electrostatic field.

8. The Fabry-Perot type tunable filter as set forth in claim 6, wherein the initial gap forming mechanism has a structure connecting the second movable portion with the fixed portion through catching parts on the second movable portion and the fixed portion.

9. A fabrication method for a Fabry-Perot type tunable filter comprising;
- processing an SOI substrate having an insulating layer and a silicon layer formed in this order on a silicon substrate, to form a movable portion shifting in a plane direction to the SOI substrate surface, a suspension supporting member supporting the movable portion, an actuator making the movable portion shifted in the plane direction and a fixed portion secured to the SOI substrate,
- bonding a first mirror structure body with a first mirror surface to a surface of the movable portion and bonding a second mirror structure body with a second mirror surface to a surface of the fixed portion upon condition that a first mirror surface and a second mirror surface are aligned face to face together in parallel, and
- forming an optical resonator constituted of the first mirror surface shifting by way of movement of the actuator and the second mirror surface secured to the fixed portion.

10. A fabrication method for a Fabry-Perot type tunable filter comprising;
- processing an SOI substrate having an insulating layer and a silicon layer formed in this order on a silicon substrate, to form a movable portion shifting in a plane direction to the SOI substrate surface, a suspension supporting member supporting the movable portion, an actuator making the movable portion shifted in the plane direction and a fixed portion secured to the SOI substrate,
- bonding a first mirror structure body with a first mirror surface to a surface of the movable portion and bonding a second mirror structure body with a second mirror surface to a surface of the fixed portion upon condition that the movable portion is caught by the fixed portion and a first mirror surface and a second mirror surface come into contact with each other, and
- releasing the catching of the movable portion and the fixed portion and providing a gap between the first mirror surface and the second mirror surface after the bonding of the first mirror structure body and the second mirror structure body, and
- forming an optical resonator constituted of the first mirror surface shifting by way of movement of the driving portion and the second mirror surface secured to the fixed portion.

11. A fabrication method for a Fabry-Perot type tunable filter comprising;
- processing an SOI substrate having an insulating layer and a silicon layer formed in this order on a silicon substrate, to form a first movable portion and a second movable portion both thereof shifting in a plane direction to the SOI substrate surface, a suspension supporting member movably supporting the movable portions, an actuator making the first movable portion shifted in the plane direction and a fixed portion secured to the SOI substrate,
- bonding a first mirror structure body with a first mirror surface to a surface of the first movable portion and bonding a second mirror structure body with a second mirror surface to a surface of the fixed portion, making the first mirror surface and the second mirror surface come into contact with each other, and,
- providing a gap between the first mirror surface and the second mirror surface by way of connecting and securing the second movable portion to the fixed portion after the bonding of the first mirror structure body and the second mirror structure body, and
- forming an optical resonator comprising the first mirror surface shifting by movement of the actuator and the second mirror surface secured to the fixed portion.

12. A Fabry-Perot type tunable filter comprising;
- a movable portion shifting in a plane direction parallel to a surface of one substrate,
- a suspension supporting member supporting the movable portion in a movable manner,
- an actuator making the movable portion shifted in the plane direction,
- a fixed portion secured to the substrate,
- a first mirror structure body having a first mirror surface formed by being bonded to the surface of the movable portion, and
- a second mirror structure body having a second mirror surface formed by being bonded to the surface of the fixed portion,
- an initial gap forming mechanism disposed in the substrate to set a distance between the first mirror surface and the second mirror surface from a state contacted directly or through a spacer interposed between the mirror surfaces to an initial gap distance on a condition that the actuator is not operated, and
- an optical resonator comprising the first mirror surface and the second mirror surface located face to face to each other in parallel, a resonating length of the optical resonator controlled by means of the distance between the mirror surfaces through operation of the actuator.

* * * * *

UNITED STATES PATENT AND TRADEMARK OFFICE
CERTIFICATE OF CORRECTION

| | |
|---|---|
| PATENT NO. | : 8,164,757 B2 |
| APPLICATION NO. | : 12/593035 |
| DATED | : April 24, 2012 |
| INVENTOR(S) | : Toshio Yamanoi et al. |

Page 1 of 1

It is certified that error appears in the above-identified patent and that said Letters Patent is hereby corrected as shown below:

Title Page, Item (73) Assignees:
Please delete "Yamachi Electronics Co., Ltd." and insert --Yamaichi Electronics Co., Ltd--

Signed and Sealed this
Twenty-fifth Day of December, 2012

David J. Kappos
*Director of the United States Patent and Trademark Office*